United States Patent
Nakamura et al.

(10) Patent No.: US 11,773,629 B2
(45) Date of Patent: Oct. 3, 2023

(54) OPERATION DETECTION DEVICE AND DOOR HANDLE

(71) Applicant: ALPS ALPINE CO., LTD., Tokyo (JP)

(72) Inventors: Toshiki Nakamura, Miyagi (JP); Daisuke Takai, Miyagi (JP); Takashi Sasaki, Miyagi (JP); Yuzuru Kawana, Miyagi (JP); Yoshiyuki Kikuchi, Miyagi (JP); Heishiro Fudo, Niigata (JP)

(73) Assignee: ALPS ALPINE CO., LTD., Tokyo (JP)

( * ) Notice: Subject to any disclaimer, the term of this patent is extended or adjusted under 35 U.S.C. 154(b) by 590 days.

(21) Appl. No.: 16/998,242

(22) Filed: Aug. 20, 2020

(65) Prior Publication Data
US 2020/0378161 A1    Dec. 3, 2020

Related U.S. Application Data

(63) Continuation of application No. PCT/JP2019/003714, filed on Feb. 1, 2019.

(30) Foreign Application Priority Data

Mar. 7, 2018  (JP) .................................. 2018-040684

(51) Int. Cl.
*H03K 17/955* (2006.01)
*E05B 81/76* (2014.01)
(Continued)

(52) U.S. Cl.
CPC .............. *E05B 81/77* (2013.01); *E05B 17/22* (2013.01); *E05B 81/78* (2013.01); *H03K 17/955* (2013.01)

(58) Field of Classification Search
CPC .. B60J 5/04; E05B 17/22; E05B 81/77; E05B 81/78; H01H 36/00; H03K 17/955;
(Continued)

(56) References Cited

U.S. PATENT DOCUMENTS

| | | | | |
|---|---|---|---|---|
| 2007/0096905 A1* | 5/2007 | Ieda | .................. | E05B 81/78 340/5.72 |
| 2011/0260741 A1* | 10/2011 | Weaver | .................. | G06F 3/0446 29/829 |
| 2018/0239045 A1* | 8/2018 | Nagao | .................. | G06F 3/0202 |

FOREIGN PATENT DOCUMENTS

| | | |
|---|---|---|
| EP | 1840845 | 10/2007 |
| JP | H09-237389 | 9/1997 |

(Continued)

OTHER PUBLICATIONS

Japanese Office Action for 2020-504863 dated Apr. 20, 2021.
International Search Report for PCT/JP2019/003714 dated Apr. 23, 2019.

*Primary Examiner* — Feba Pothen
*Assistant Examiner* — Brent J Andrews
(74) *Attorney, Agent, or Firm* — IPUSA, PLLC

(57) ABSTRACT

An operation detection device includes an electrostatic sensor accommodated inside a casing and including a first conductor and a second conductor, and a controller electrically connected to the first conductor and the second conductor, and applies a voltage to each of the first conductor and the second conductor, to measure an electrostatic capacitance of each of the first conductor and the second conductor. The first conductor is arranged in and the second conductor is not arranged in a detection region in which an operating body is detected by the electrostatic sensor. The first conductor and the second conductor are arranged in a non-detection region in which the operating body is not detected.

18 Claims, 32 Drawing Sheets

(51) Int. Cl.
  *E05B 17/22*   (2006.01)
  *E05B 81/78*   (2014.01)
(58) Field of Classification Search
  CPC .. H03K 3/00; H03K 4/00; H03K 5/00; H03K 6/00; H03K 7/00; H03K 9/00; H03K 11/00; H03K 12/00; H03K 17/00; H03K 19/00; H03K 21/00; H03K 23/00; H03K 25/00; H03K 27/00; H03K 29/00; H03K 99/00; H03K 2217/00
  See application file for complete search history.

(56) References Cited

FOREIGN PATENT DOCUMENTS

| | | |
|---|---|---|
| JP | H10-308149 | 11/1998 |
| JP | 2003-221948 | 8/2003 |
| JP | 2007-270517 | 10/2007 |
| JP | 2017-049139 | 3/2017 |
| JP | 2017-212692 | 11/2017 |

* cited by examiner

FIG.5
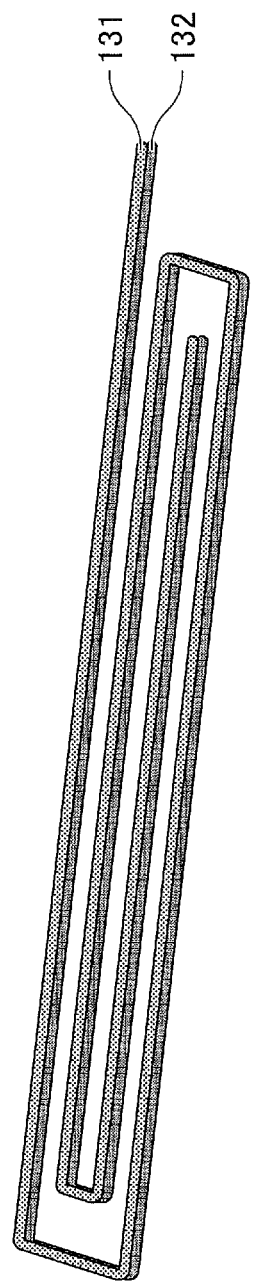
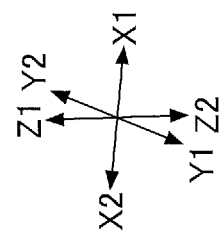

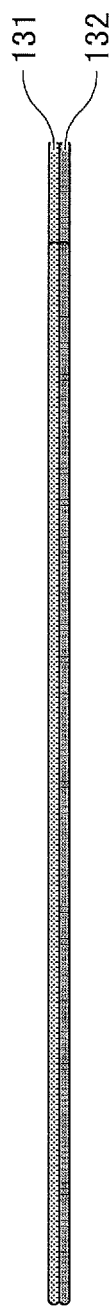
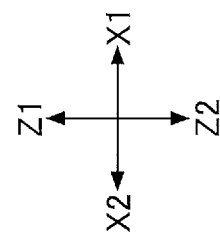
FIG.6

FIG.7
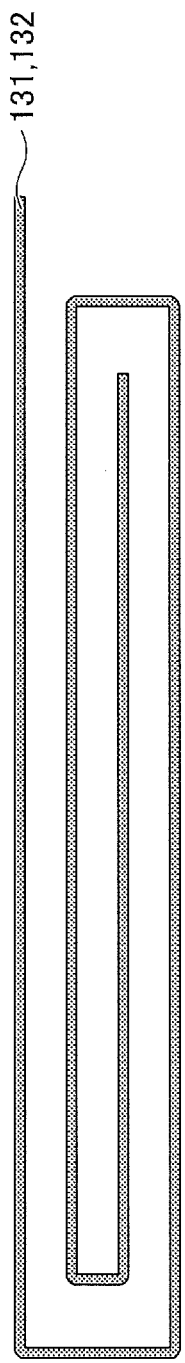
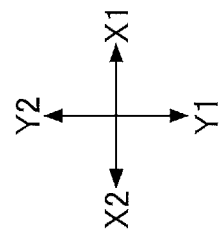

FIG.17
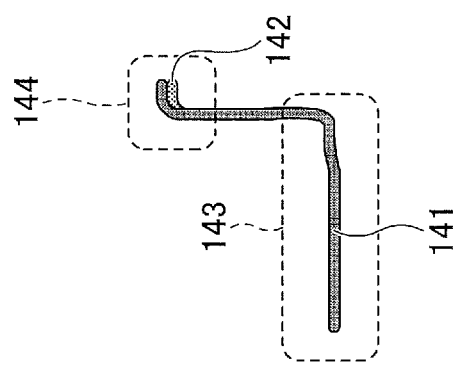
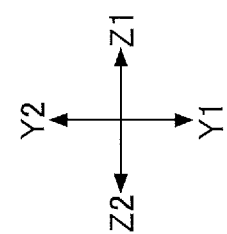

OPERATION DETECTION DEVICE AND DOOR HANDLE

CROSS-REFERENCE TO RELATED APPLICATIONS

This application is a continuation application of International Application No. PCT/JP2019/003714 filed on Feb. 1, 2019 and designated the U.S., which is based upon and claims priority to Japanese Patent Application No. 2018-040684 filed on Mar. 7, 2018, the entire contents of which are incorporated herein by reference.

BACKGROUND OF THE INVENTION

1. Field of the Invention

The disclosed embodiments relate to an operation detection device and a door handle.

2. Description of the Related Art

A door handle for opening and closing a door is provided on the door of an automobile or the like. In recent years, doors, that can be locked or unlocked by touching or making a gestural command by a hand positioned close to a door handle, have been introduced. Such a door handle is provided with an electrostatic sensor or the like for detecting a manual operation, and the electrostatic sensor is provided inside the door handle in a state accommodated within a casing.

An example of the door handle provided with the electrostatic sensor is described in Japanese Laid-Open Patent Publication No. 2003-221948, for example.

The door handle described above is provided with a locking electrostatic lock sensor for locking the door, and an unlocking electrostatic sensor for unlocking the door. The unlocking electrostatic sensor is provided inside the door handle, and unlocks the door when a finger of a person's hand approaches the door handle and is detected by the unlocking electrostatic sensor.

When locking the door, the hand is positioned close to a predetermined region of the door handle to make contact with the door handle. For this reason, in a case where the hand makes contact with a region other than the predetermined region of the door handle, it is undesirable for the door to be locked even in such a case, because this manual operation is not intended to lock the door.

Accordingly, there is a demand for an operation detection device that can operate as a locking electrostatic sensor capable of detecting a locking operation with respect to the door handle only when the hand approaches a specific region. In other words, there is a demand for an operation detection device capable of detecting a manual operation only when the hand approaches the specific region.

SUMMARY OF THE INVENTION

It is an object in one aspect of the embodiments to provide an operation detection device and a door handle, which can detect a manual operation only when a hand approaches a specific region.

According to one aspect of the embodiments, an operation detection device includes an electrostatic sensor, accommodated inside a casing, and including a first conductor and a second conductor; and a controller electrically connected to the first conductor and the second conductor, wherein the controller applies a voltage to each of the first conductor and the second conductor, to measure an electrostatic capacitance of each of the first conductor and the second conductor, and wherein the first conductor is arranged in and the second conductor is not arranged in a detection region in which an operating body is detected by the electrostatic sensor, and the first conductor and the second conductor are arranged in a non-detection region in which the operating body is not detected.

According to another aspect of the embodiments, an operation detection device includes an electrostatic sensor, accommodated inside a casing, and including a first conductor and a second conductor; and a controller electrically connected to the first conductor and the second conductor, wherein the controller applies a voltage to each of the first conductor and the second conductor, to measure an electrostatic capacitance of each of the first conductor and the second conductor, wherein the first conductor and the second conductor are arranged side by side along a first direction in a detection region in which an operating body is detected by the electrostatic sensor, wherein the first conductor and the second conductor are arranged side by side along a second direction in a non-detection region in which the operating body is not detected, and wherein the first direction and the second direction are approximately perpendicular to each other.

According to still another aspect of the embodiments, a door handle to be mounted on a door of a vehicle, includes the operation detection device described above, wherein the casing is a door handle casing, formed by an inner casing and an outer casing.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 5 is a perspective view of an unlocking electrostatic sensor according to the first embodiment.

FIG. 6 is a top view of the unlocking electrostatic sensor according to the first embodiment.

FIG. 7 is a front view of the unlocking electrostatic sensor according to the first embodiment.

FIG. 17 is a side view of the locking electrostatic sensor according to a first embodiment.

DESCRIPTION OF THE EMBODIMENTS

Figure 1:
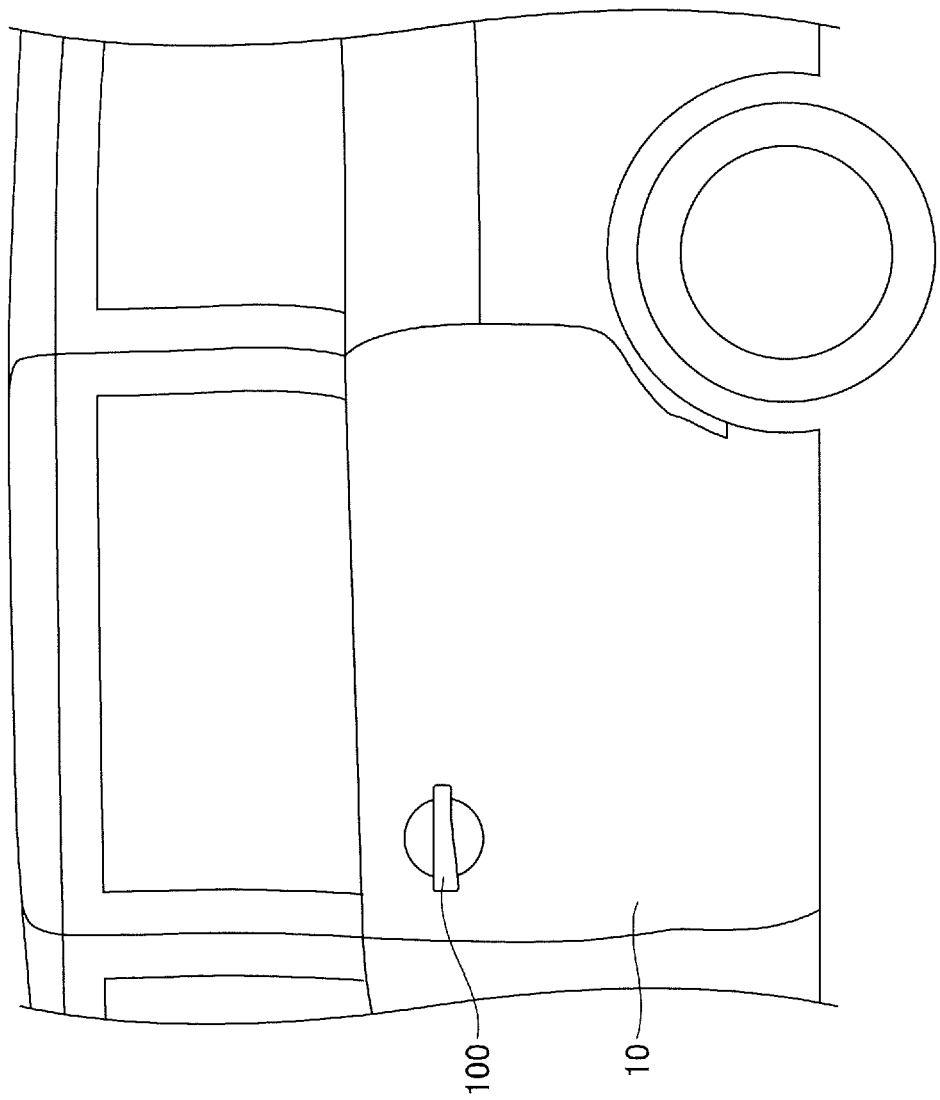
FIG. 1 is a diagram for explaining a door mounted with a door handle according to a first embodiment.

Embodiments will be described in the following. The same members or the like are designated by the same reference numerals, and a description thereof will be omitted. In addition, in this specification, a X1-X2 direction, a Y1-Y2 direction, and a Z1-Z2 direction are mutually perpendicular directions. Further, a plane including the X1-X2 direction and the Y1-Y2 direction is referred to as an XY-plane, a plane including the Y1-Y2 direction and the Z1-Z2 direction is referred to as a YZ-plane, and a plane including the Z1-Z2 direction and the X1-X2 direction is referred to as a ZX-plane.

Generally, in a door handle using an electrostatic sensor, a manual operation is detected when a hand, that is an operating body, approaches the door handle, a distance between the hand and an electrode that serves as the electrostatic sensor becomes short, and an electrostatic capacitance between the hand and the electrode increases and exceeds a predetermined value. Such a change in the electrostatic capacitance can be detected from an amount of current that flows when a predetermined voltage is applied to the electrode. Accordingly, regardless of the direction from which the hand approaches the door handle, the manual operation is detected when the hand approaches (or moves to a position near) the door handle.

Hence, even when the hand movement is not intended to lock the door, there are cases where the door becomes locked when the hand approaches the door handle. Such an unintended locking of the door is undesirable.

First Embodiment (Door Handle and Operation Detection Device)

Figure 2:
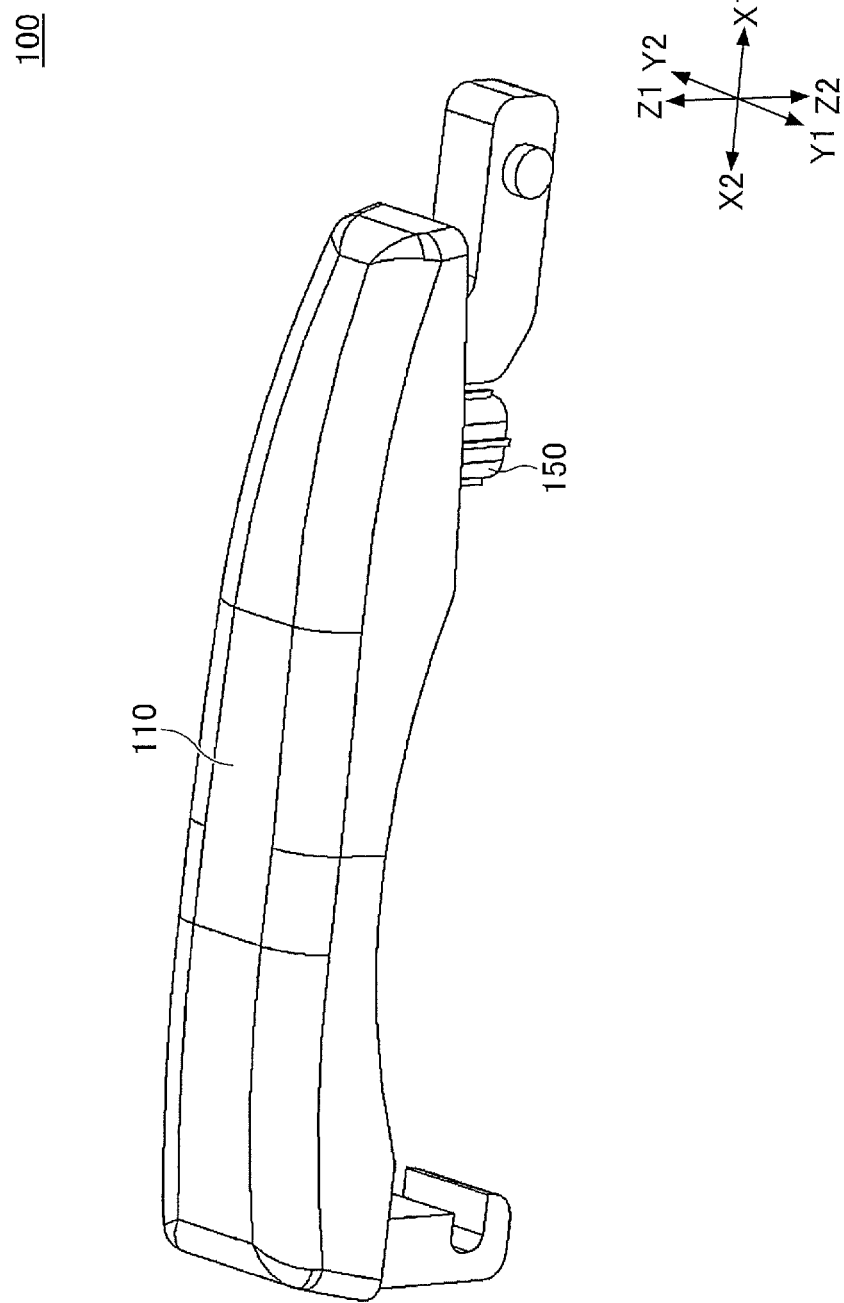
FIG. 2 is a perspective view of the door handle according to the first embodiment.
Figure 3:
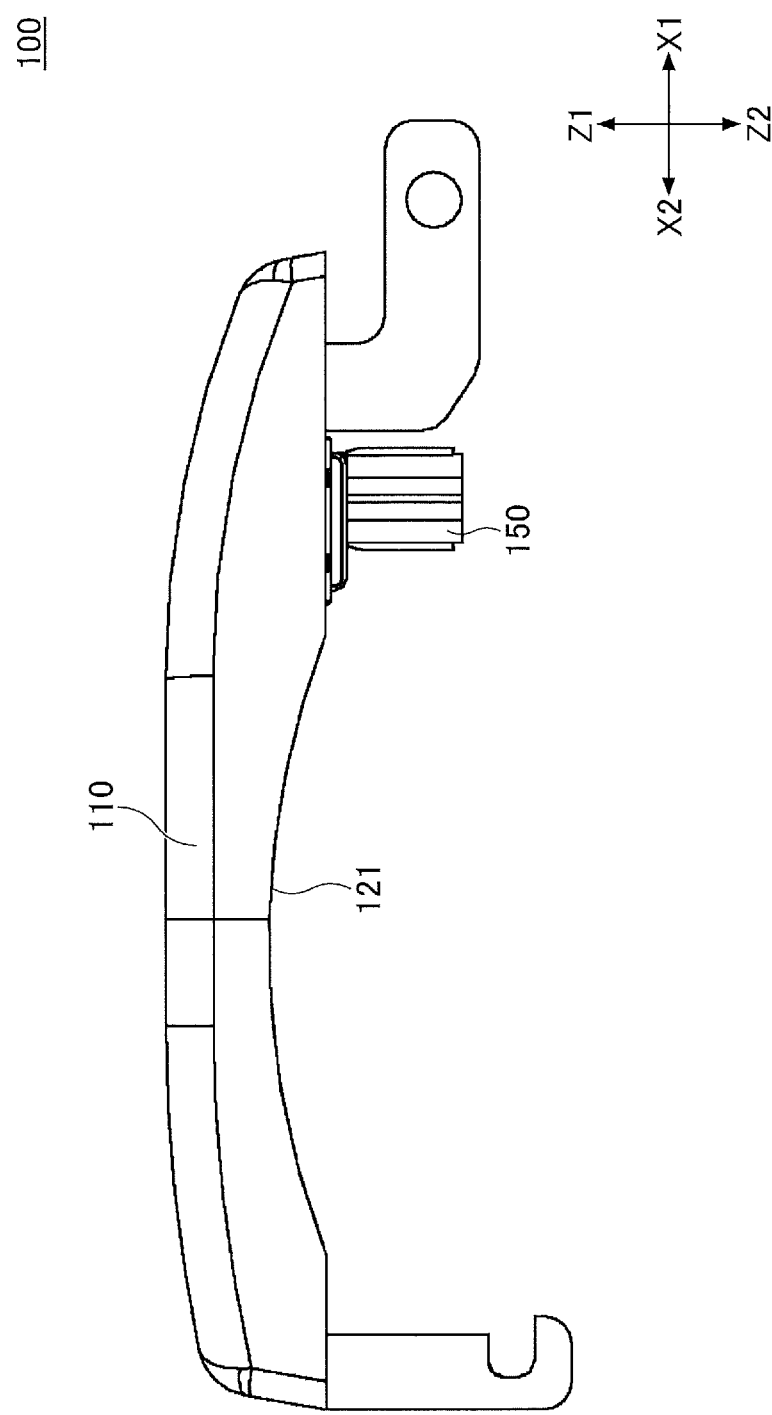
FIG. 3 is a top view of the door handle according to the first embodiment.
Figure 4:
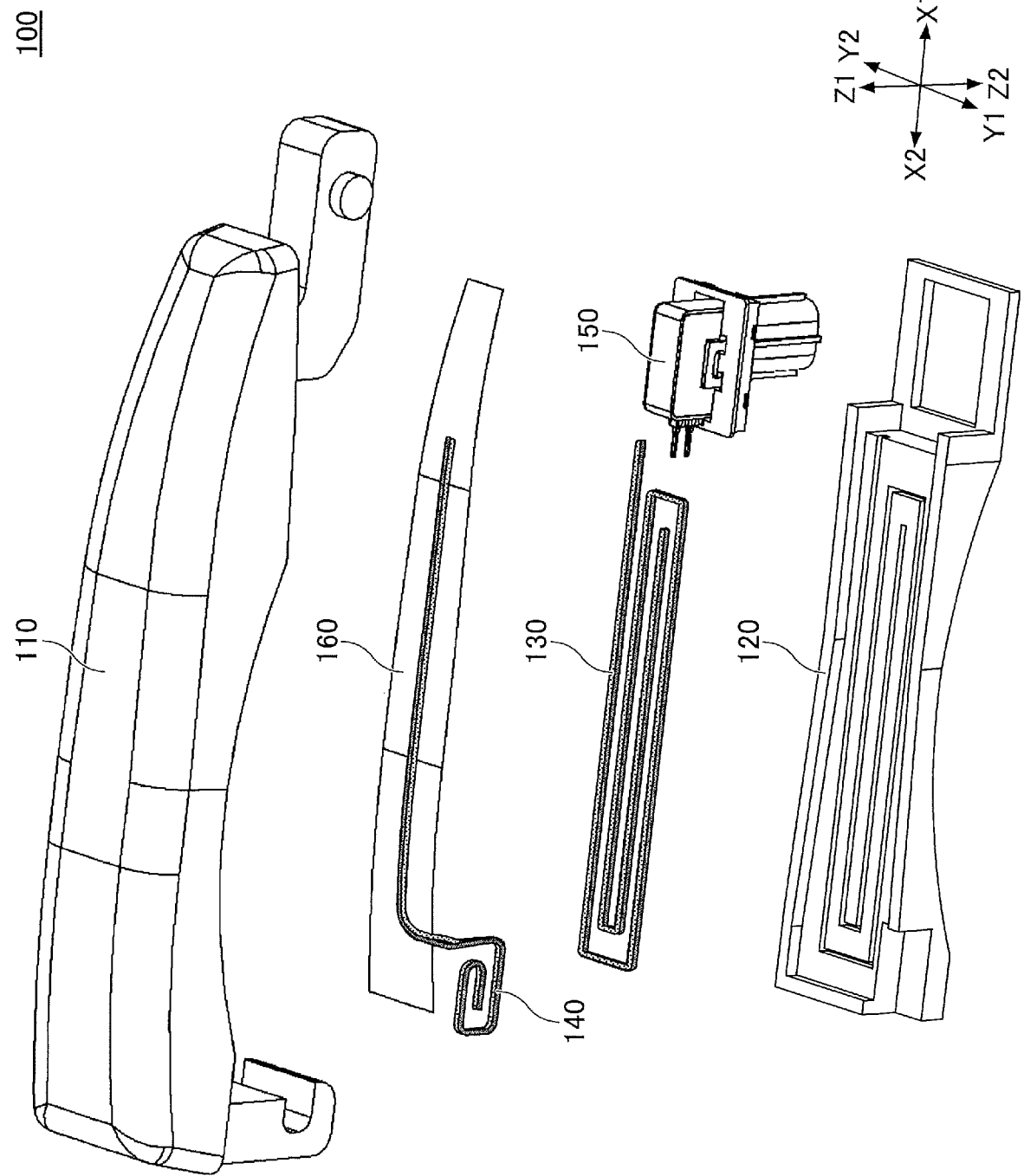
FIG. 4 is a disassembled perspective view of the door handle according to the first embodiment.

The door handle of a vehicle, and an operation detection device will be described in with reference to FIG. 1 through FIG. 4. FIG. 1 is a diagram for explaining the door of the vehicle, such as an automobile or the like, mounted with a door handle 100 according to a first embodiment. FIG. 2 is a perspective view of the door handle 100, FIG. 3 is a top view of the door handle 100, and FIG. 4 is a disassembled perspective view of the door handle 100.

As illustrated in FIG. 1, the door handle 100 according to this embodiment is mounted on a door 10 of the automobile or the like, and an operation detection device according to this embodiment is provided inside the door handle 100.

A door handle casing, that forms a housing portion of the door handle 100, is formed by an outer casing 110 and an inner casing 120. An unlocking electrostatic sensor 130, a locking electrostatic sensor 140, a control device (or control unit, or processor) 150, an inner lid 160, or the like are provided inside the casing that is covered by the outer casing 110 and the inner casing 120.

The door handle 100 is mounted so that the inner side on the Z2-side facing the door 10 is the side of the inner casing 120, and the outer side on the Z1-side, facing the side opposite to the side facing the door 10, is the side of the outer casing 110. When unlocking the door handle 100, an manual operation is generally performed by inserting the hand to the inner side of the door, to make contact with a surface (hereinafter referred to as an "inner surface") 121 on the inner side of the door handle 100. Accordingly, when unlocking the door, the hand is moved from the Z2-side toward the Z1-side with respect to the door handle 100, to make contact with a surface on the Z2-side that forms the inner surface 121 on the inner side of the door handle 100. The inner surface 121 caves in toward the Z1-side at a center portion thereof, to facilitate gripping of the door handle 100 by the person's hand. In this specification, in the door handle 100, the inner surface 121 on the inner side of the door handle 100 may be referred to as a detection surface.

(Unlocking Electrostatic Sensor)

The unlocking electrostatic sensor 130 according to this embodiment includes (is formed by) two unlock conductor wires called parallel cables, namely, a first unlock conductor 131 and a second unlock conductor 132, as illustrated in FIG. 5 through FIG. 7. The first unlock conductor 131 is provided on the Z1-side, and the second unlock conductor 132 is provided on the Z2-side. Accordingly, the first unlock conductor 131 and the second unlock conductor 132 are arranged approximately perpendicular with respect to the inner surface 121 on the inner side of the door handle 100, so that the second unlock conductor 132 is positioned closer to the side of the inner surface 121, that is, closer to the detection surface, than the first unlock conductor 131. In other words, with respect to the inner surface 121 approximately parallel to the Y1-Y2 direction, the first unlock conductor 131 and the second unlock conductor 132 are arranged in the Z1-Z2 direction, and the second unlock conductor 132 is positioned closer to the Z2-side than the first unlock conductor 131. FIG. 5 is a perspective view of the unlocking electrostatic sensor 130, FIG. 6 is a top view of the unlocking electrostatic sensor 130, and FIG. 7 is a front view of the unlocking electrostatic sensor 130.

The parallel cables forming the two unlock conductors that form the unlocking electrostatic sensor 130 can be bent relatively freely. Hence, the unlocking electrostatic sensor 130 can be shaped into a desired shape relatively easily. In this embodiment, the unlocking electrostatic sensor 130, including the first unlock conductor 131 and the second unlock conductor 132, is wound spirally on a plane parallel to the XY-plane. A value of the detected electrostatic capacitance becomes large, by spirally winding the unlocking electrostatic sensor 130. Particularly, the value of the electrostatic capacitance that is detected becomes large with respect to the hand contacting or approaching from the Z-direction perpendicular to the XY-plane.

Figure 8:
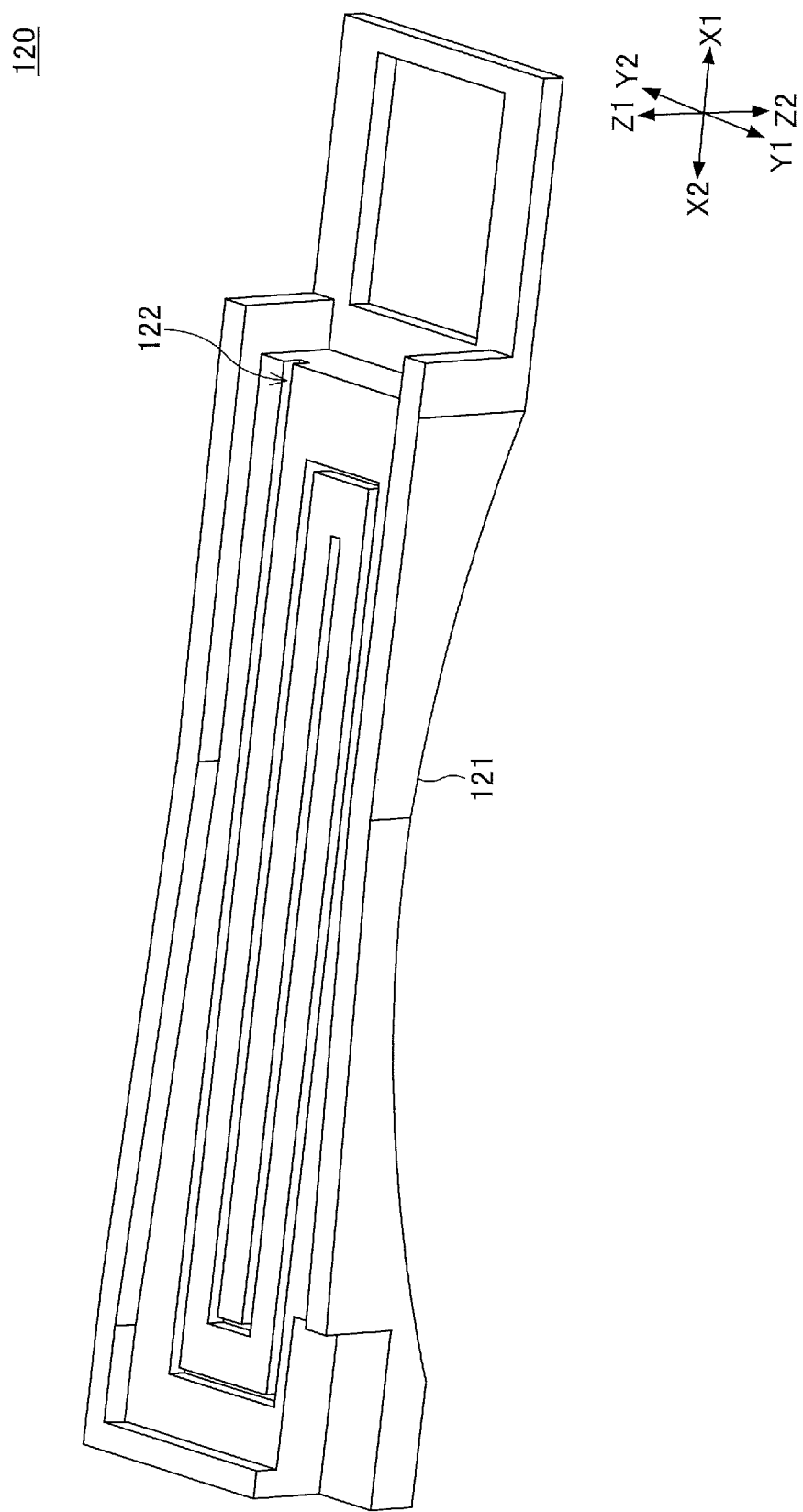
FIG. 8 is a perspective view of an inner casing according to the first embodiment.
Figure 9:
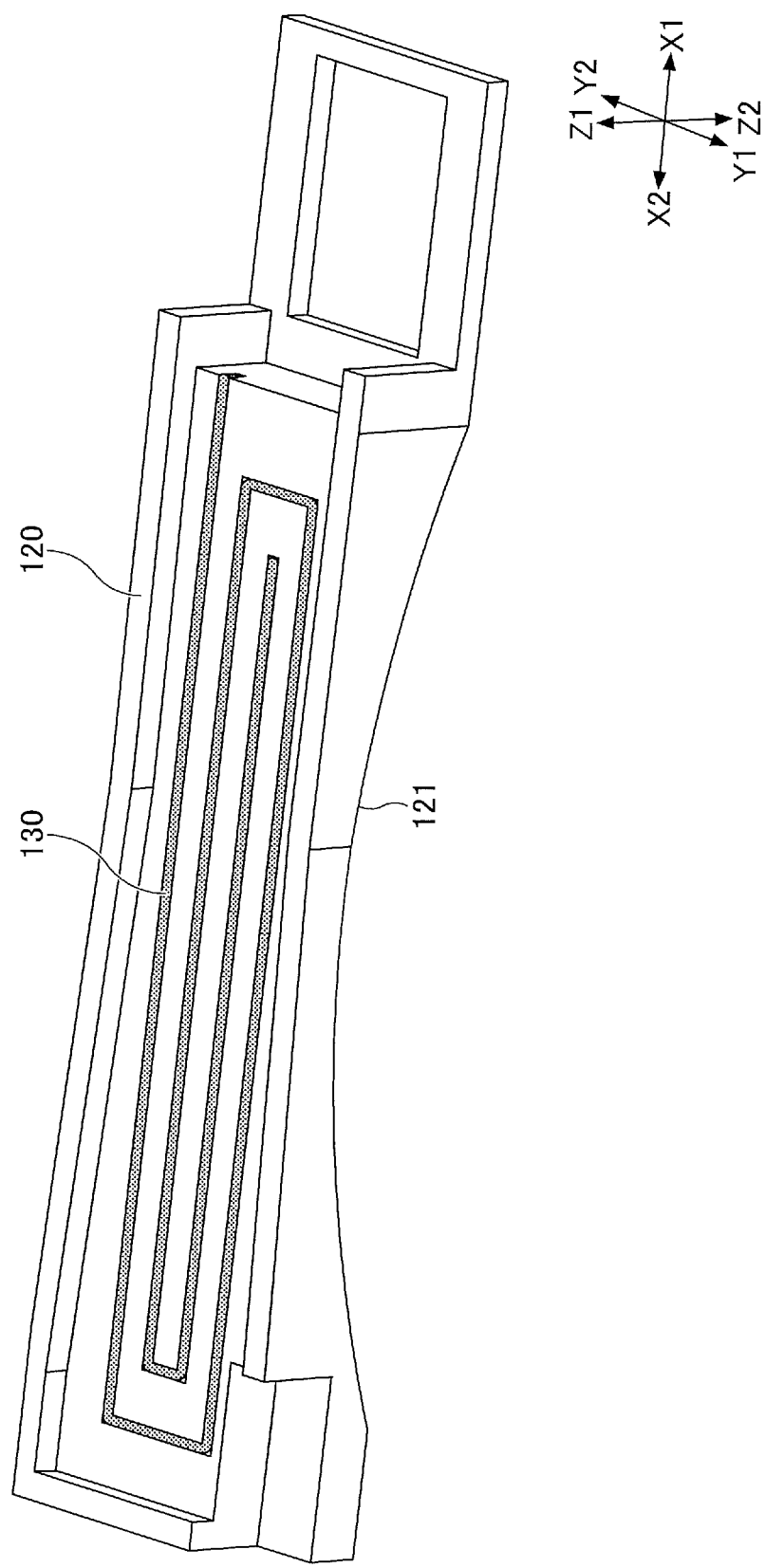
FIG. 9 is a perspective view of the unlocking electrostatic sensor in a state accommodated within the inner casing.

As illustrated in FIG. 8, a groove 122 for accommodating the unlocking electrostatic sensor 130 is provided on the inner side of the inner casing 120 according to this embodiment. By inserting the unlocking electrostatic sensor 130 into the groove 122, a state where the first unlock conductor 131 is arranged on the Z1-side and the second unlock conductor 132 is arranged on the Z2-side is maintained, as illustrated in FIG. 9.

Figure 10:
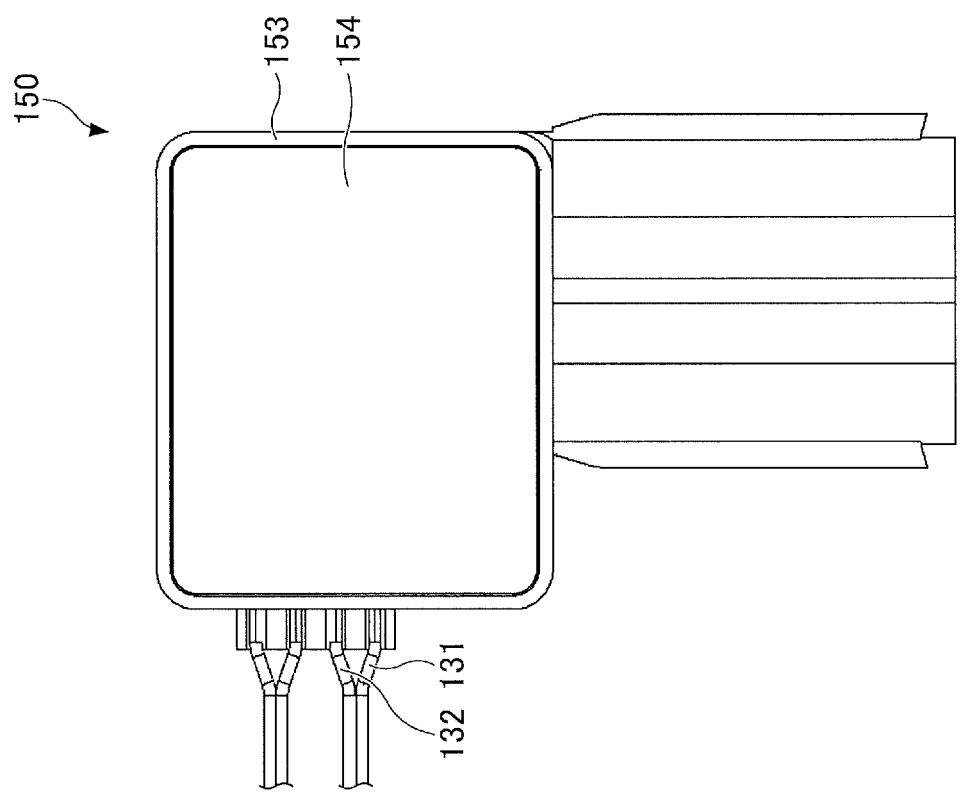
FIG. 10 is an external view of a control device according to the first embodiment.
Figure 11:
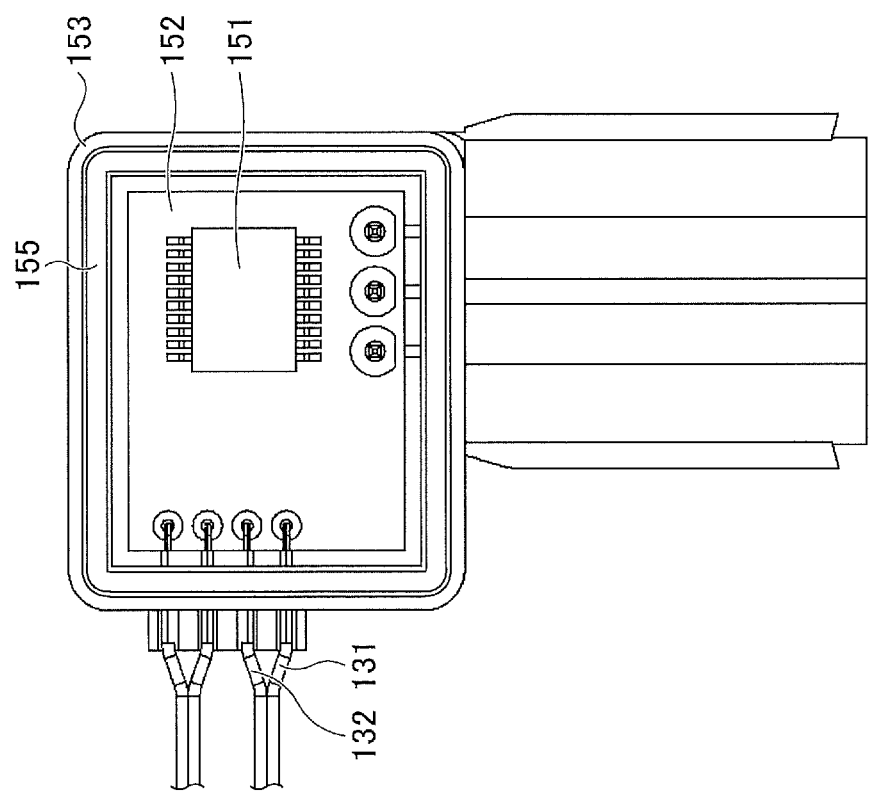
FIG. 11 is a diagram for explaining an inside of the control device according to the first embodiment.

In this embodiment, one end portion of the first unlock conductor 131 and one end portion of the second unlock conductor 132, which form an outer end of the unlocking electrostatic sensor 130, are respectively connected to the control device 150 illustrated in FIG. 10 and FIG. 11. A circuit board 152, mounted with a control circuit 151 that forms a controller, is provided inside the control device 150. The circuit board 152 mounted with the control circuit 151 is covered by a control device housing, to prevent water from entering inside from the outside. The control device housing is formed by a casing 153 and a lid portion 154, and is fixed in a state where an O-ring 155 is inserted between the casing 153 and the lid portion 154. The control device housing of the control device 150 has a structure that prevents water from entering inside the control device housing. FIG. 10 is an enlarged view of an upper surface side of the control device 150, and FIG. 11 is an enlarged view of the inside of the control device 150 in a state where the lid portion 154 is removed.

Figure 12:
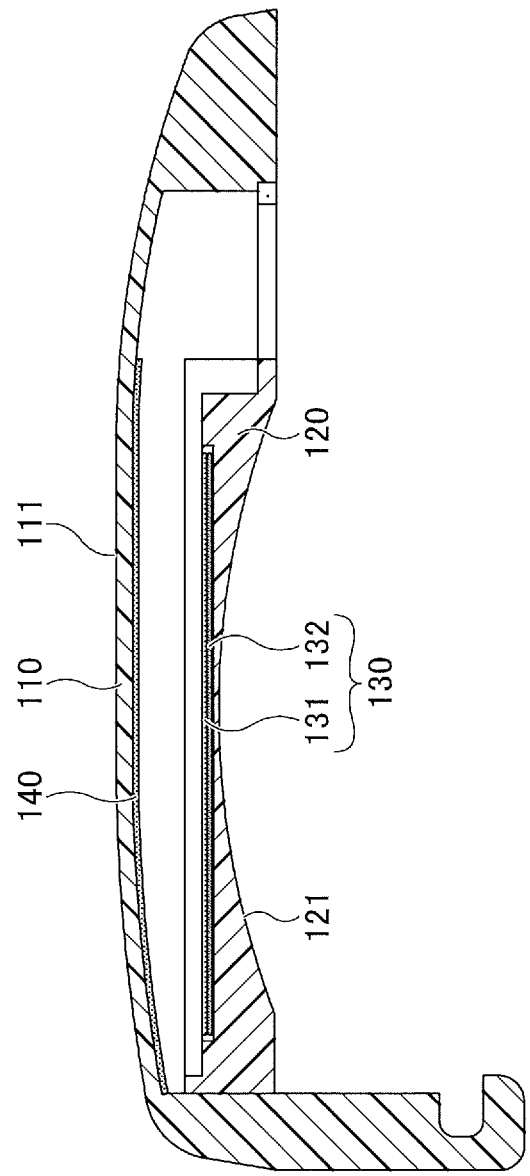
FIG. 12 is a cross sectional view of the door handle according to the first embodiment.

As illustrated in FIG. 12, the unlocking electrostatic sensor 130 is arranged closer to the inner surface 121 of the inner casing 120, that forms an operating surface when unlocking the door handle 100, than an outer surface 111 of the outer casing 110 of the door handle 100. The operation detection device according to this embodiment is formed by the unlocking electrostatic sensor 130 and the control device 150. FIG. 12 is a cross sectional view of the door handle according to this embodiment, cut along a plane parallel to the ZX-plane, and the illustration of the control device 150 is omitted for the sake of convenience.

(Detection by Unlocking Electrostatic Sensor 130)

Next, detection by the unlocking electrostatic sensor 130 will be described. In the unlocking electrostatic sensor 130, a voltage is applied to each of the first unlock conductor 131 and the second unlock conductor 132 of the unlocking electrostatic sensor 130 from the control circuit 151 serving as the controller in the control device 150, and the electrostatic capacitance of the first unlock conductor 131 and the second unlock conductor 132 is measured.

When the hand, that is an example of the operating body, approaches the unlocking electrostatic sensor 130, the value of the electrostatic capacitance detected by the first unlock conductor 131 is different from the value of the electrostatic capacitance detected by the second unlock conductor 132, depending on the direction from which the hand approaches the unlocking electrostatic sensor 130.

A more specific description will be given of this embodiment, with reference to FIG. 5 through FIG. 7. In a case where the hand approaches the unlocking electrostatic sensor 130 from the Z2-side toward the Z1-side, the distance between the hand and the second unlock conductor 132 becomes shorter than the distance between the hand and the first unlock conductor 131. Accordingly, in this case, the value of the electrostatic capacitance detected by the second unlock conductor 132 is greater than the value of the electrostatic capacitance detected by the first unlock conductor 131, and a difference value obtained by subtracting the value of the electrostatic capacitance detected by the first unlock conductor 131 from the value of the electrostatic capacitance detected by the second unlock conductor 132 becomes a positive value.

Instead of determining whether the difference value is a positive value or a negative value in order to make the determination on whether the hand is approaching the first unlock conductor 131 or the second unlock conductor 132 of the unlocking electrostatic sensor 130, it is possible to make the determination with reference to whether or not each value exceeds a predetermined value, whether a change in each value occurs in a positive direction, or whether a change in each value occurs in a negative direction. The determination on whether the hand is approaching the first unlock conductor 131 or the second unlock conductor 132 of the unlocking electrostatic sensor 130, may be made with reference to a comparison of each value with a predetermined value, or the direction in which the change in each value occurs, by taking into consideration inconsistencies and variations in a reference value of an output for each electrostatic sensor. The same applies to the locking electrostatic sensor 140 which will be described later.

In addition, in a case where the hand approaches the unlocking electrostatic sensor 130 from the Z1-side toward the Z2-side, the distance between the hand and the first unlock conductor 131 becomes shorter than the distance between the hand and the second unlock conductor 132. Accordingly, in this case, the value of the electrostatic capacitance detected by the second unlock conductor 132 is smaller than the value of the electrostatic capacitance detected by the first unlock conductor 131, and the difference value obtained by subtracting the value of the electrostatic capacitance detected by the first unlock conductor 131 from the value of the electrostatic capacitance detected by the second unlock conductor 132 becomes a negative value Moreover, in a case where the hand approaches the unlocking electrostatic sensor 130 from the Y1-side or from the Y2-side, the distance between the hand and the first unlock conductor 131 and the distance between the hand and the second unlock conductor 132 are approximately the same. Accordingly, in this case, the value of the electrostatic capacitance detected by the first unlock conductor 131 and the value of the electrostatic capacitance detected by the second unlock conductor 132 are approximately the same, and the difference value obtained by subtracting the value of the electrostatic capacitance detected by the first unlock conductor 131 from the value of the electrostatic capacitance detected by the second unlock conductor 132 is approximately zero.

As described above, when unlocking the door 10, the hand approaches the door handle 100 from the Z2-side toward the Z1-side, and makes contact with the Z2-side surface of the door handle 100. Hence, in the case where the difference value obtained by subtracting the value of the electrostatic capacitance detected by the first unlock conductor 131 from the value of the electrostatic capacitance detected by the second unlock conductor 132 is the positive value, it may be determined that the hand is positioned on the Z2-side of the door handle 100, and the door 10 is unlocked only in this case.

Further, in the case where the difference value obtained by subtracting the value of the electrostatic capacitance detected by the first unlock conductor 131 from the value of the electrostatic capacitance detected by the second unlock conductor 132 is zero, it may be determined that the hand is positioned on the Y1-side or the Y2-side of the door handle 100, and in this case, the door 10 is not unlocked.

In addition, in the case where the difference value obtained by subtracting the value of the electrostatic capacitance detected by the first unlock conductor 131 from the value of the electrostatic capacitance detected by the second unlock conductor 132 is the negative value, it may be determined that the hand is positioned on the Z1-side of the door handle 100, and in this case, the door 10 is not unlocked.

By performing the control described above, the door 10 is unlocked only in the case where an operation intended to unlock the door lock is performed, that is, only when the hand makes contact with the Z2-side surface of the door handle 100. Hence, it is possible to prevent the door lock from being unlocked by the movement of the hand that is not intended to unlock the door 10, and an erroneous detection of unlocking the door lock can be prevented.

Figure 13:
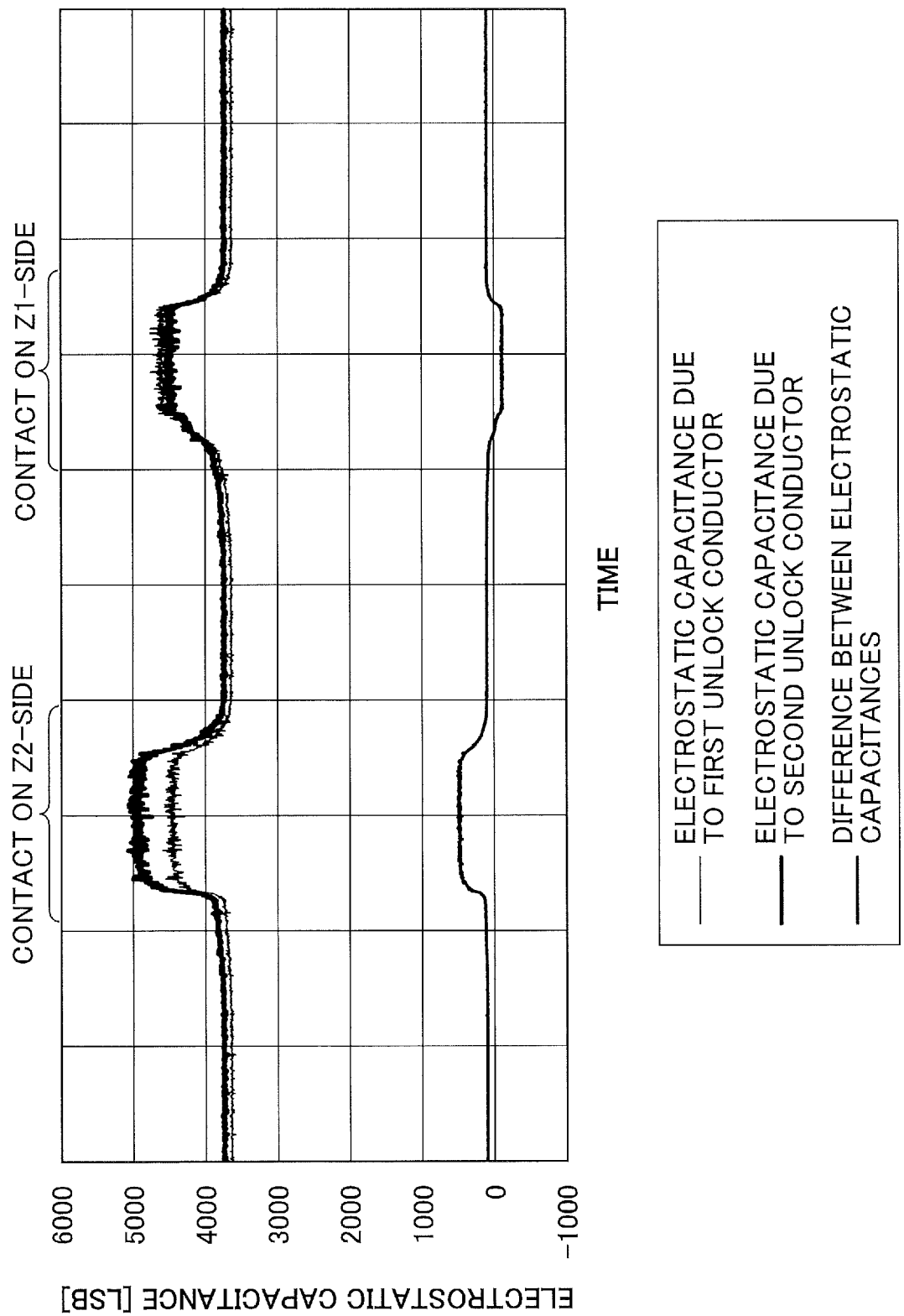
FIG. 13 is a diagram for explaining unlocking of a door by the door handle according to the first embodiment.

FIG. 13 illustrates the electrostatic capacitance detected by the first unlock conductor 131, the electrostatic capacitance detected by the second unlock conductor 132, and the difference value obtained by subtracting the electrostatic capacitance detected by the first unlock conductor 131 from the electrostatic capacitance detected by the second unlock conductor 132, for the case where the hand makes contact with the Z2-side of the door handle 100, and the case where the hand makes contact with the Z1-side of the door handle 100.

As illustrated in FIG. 13, in the case where the hand makes contact with the Z2-side of the door handle 100, both the electrostatic capacitance detected by the first unlock conductor 131 and the electrostatic capacitance detected by the second unlock conductor 132 increase. However, the electrostatic capacitance detected by the second unlock conductor 132 is greater than the electrostatic capacitance detected by the first unlock conductor 131, and the difference value obtained by subtracting the electrostatic capacitance detected by the first unlock conductor 131 from the electrostatic capacitance detected by the second unlock conductor 132 becomes the positive value.

In addition, in the case where the hand makes contact with the Z1-side of the door handle 100, both the electrostatic capacitance detected by the first unlock conductor 131 and the electrostatic capacitance detected by the second unlock conductor 132 increase. However, the electrostatic capacitance detected by the second unlock conductor 132 is smaller than the electrostatic capacitance detected by the first unlock conductor 131, and the difference value obtained by subtracting the electrostatic capacitance detected by the first unlock conductor 131 from the electrostatic capacitance detected by the second unlock conductor 132 becomes the negative value.

Although not illustrated in FIG. 13, in the case where the hand makes contact with the Y1-side or the Y2-side of the door handle 100, both the electrostatic capacitance detected by the first unlock conductor 131 and the electrostatic capacitance detected by the second unlock conductor 132 increase. However, the electrostatic capacitance detected by the first unlock conductor 131 and the electrostatic capacitance detected by the second unlock conductor 132 are approximately the same, and the difference value obtained by subtracting the electrostatic capacitance detected by the first unlock conductor 131 from the electrostatic capacitance detected by the second unlock conductor 132 becomes approximately zero.

Accordingly, in the control circuit 151 of the control device 150, the control to unlock the door lock is performed only in the case where the difference value obtained by subtracting the electrostatic capacitance detected by the first unlock conductor 131 from the electrostatic capacitance detected by the second unlock conductor 132 becomes the positive value, to prevent the door lock from being erroneously unlocked.

Hence, in this embodiment, in the case where the hand makes contact with the Z2-side of the door handle 100, the door lock is unlocked. However, in the case where the hand makes contact with the Z1-side of the door handle 100 or makes contact with the Y1-side or the Y2-side of the door handle 100, it is determined that the operation is not intended to unlock the door lock, and the door lock is not unlocked.

In other words, in the door handle 100 according to this embodiment, in the cases where the hand makes contact with the Z1-side, the Y2-side, and the Y1-side of the door handle 100, it is determined that the detected operation is not intended to unlock the door lock, and it is determined that the detected operation is intended to unlock the door lock only in the case where the hand makes contact with the Z2-side of the door handle 100.

(Locking Electrostatic Sensor 140)

Figure 14:
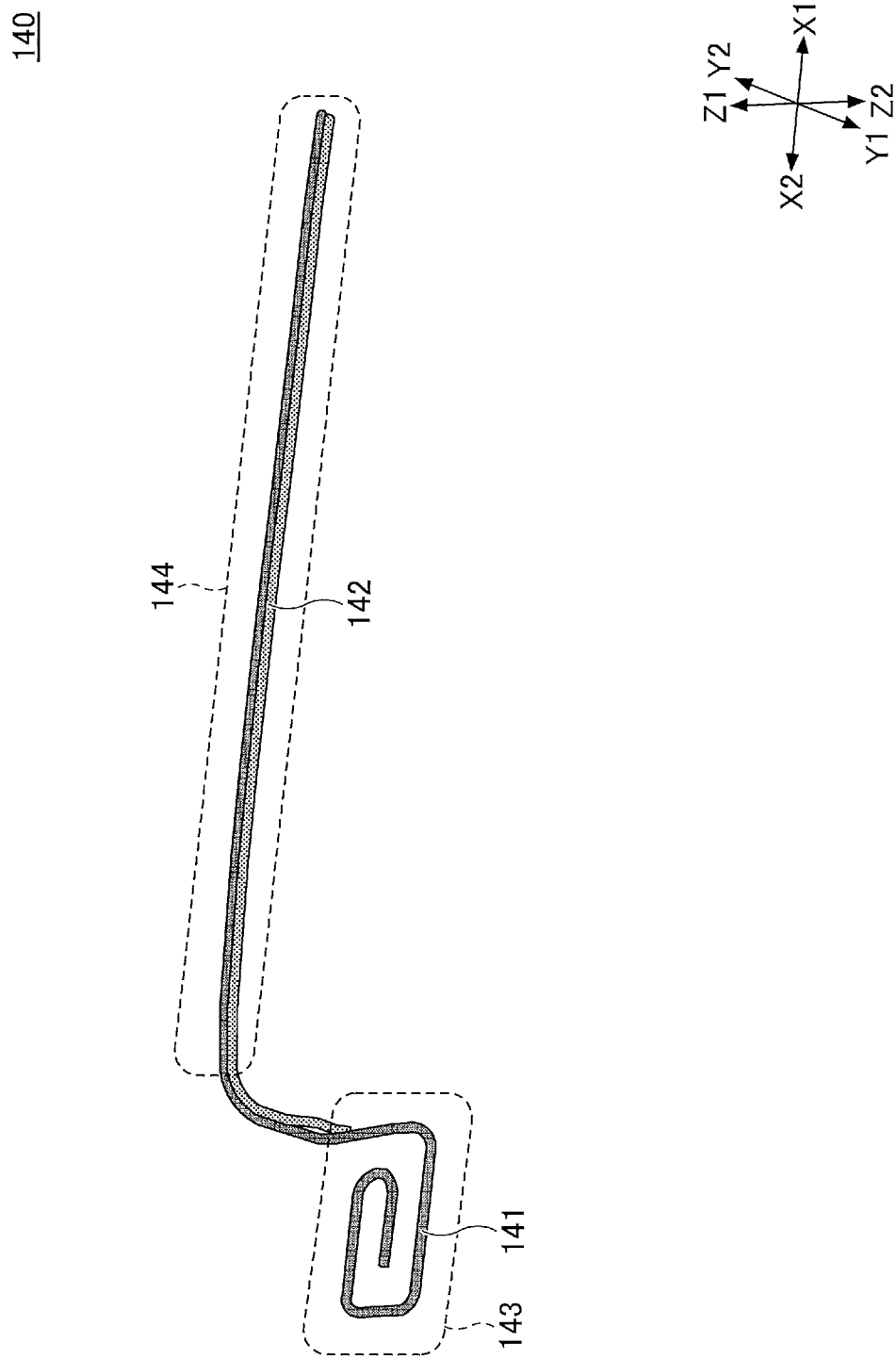
FIG. 14 is a perspective view of a locking electrostatic sensor according to the first embodiment.
Figure 15:
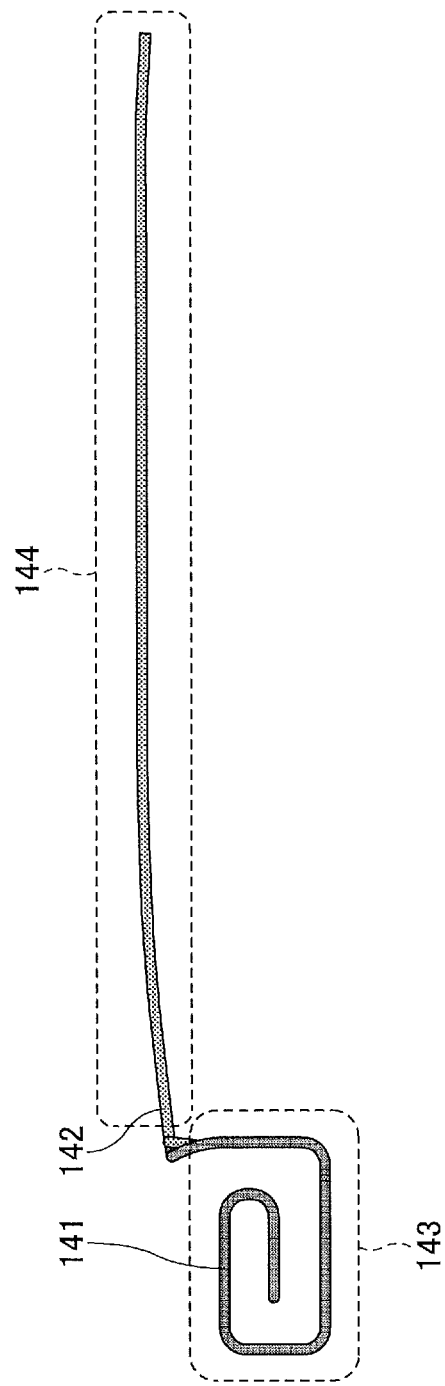
FIG. 15 is a top view of the locking electrostatic sensor according to the first embodiment.
Figure 16:
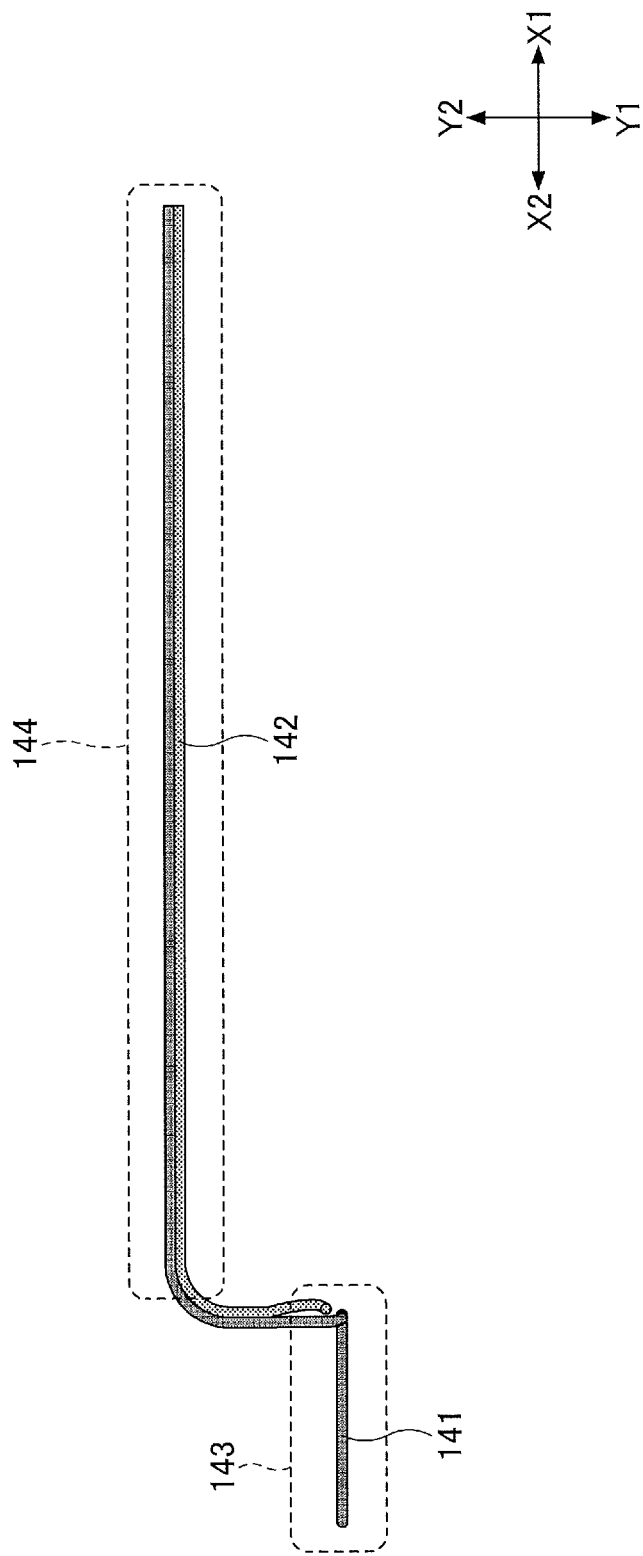
FIG. 16 is a front view of the locking electrostatic sensor according to the first embodiment.

Next, the electrostatic sensor 140 for locking will be described. The operation detection device according to this embodiment is formed by the locking electrostatic sensor 140 and the control device 150. The locking electrostatic sensor 140 according to this embodiment includes (is formed by) two lock conductor wires called parallel cables, namely, a first lock conductor 141 and a second lock conductor 142, as illustrated in FIG. 14 through FIG. 17. FIG. 14 is a perspective view of the locking electrostatic sensor 140, FIG. 15 is a top view of the locking electrostatic sensor 140, FIG. 16 is a front view of the locking electrostatic sensor 140, and FIG. 17 is a side view of the locking electrostatic sensor 140.

The locking electrostatic sensor 140 according to this embodiment includes a detection region 143 and a non-detection region 144. The locking electrostatic sensor 140 detects the approaching hand only in a case where the hand is approaching the detection region 143, and does not detect the approaching hand in a case where the hand is approaching the non-detection region 144. In this locking electrostatic sensor 140, the detection region 143 for detecting the locking operation is provided on the X2-side, and the locking electrostatic sensor 140 is connected to the control device 150 on the X1-side. However, a portion between the detection region 143 and the control device 150 forms the non-detection region 144 for avoiding an erroneous operation during the unlocking operation.

In the locking electrostatic sensor 140 according to this embodiment, in the non-detection region 144, two conductors, namely, the first lock conductor 141 and the second lock conductor 142, are provided. However, in the detection region 143, only the first lock conductor 141 is provided, and the second lock conductor 142 is not provided in the detection region 143.

The conductor wires that form the first lock conductor 141 can be bent relatively freely. Hence, the first lock conductor 141 can be shaped into a desired shape relatively easily. In the detection region 143 of the locking electrostatic sensor 140 according to this embodiment, the first lock conductor 141 is wound spirally on a plane parallel to the ZX-plane. A value of the detected electrostatic capacitance becomes large, by spirally winding the first lock conductor 141. Particularly, the value of the electrostatic capacitance that is detected becomes large with respect to the hand contacting or approaching from the Y-direction perpendicular to the ZX-plane.

In this embodiment, one end portion of the first lock conductor 141 and one end portion of the second lock conductor 142 in the locking electrostatic sensor 140 are respectively connected to the control device 150.

Figure 18:
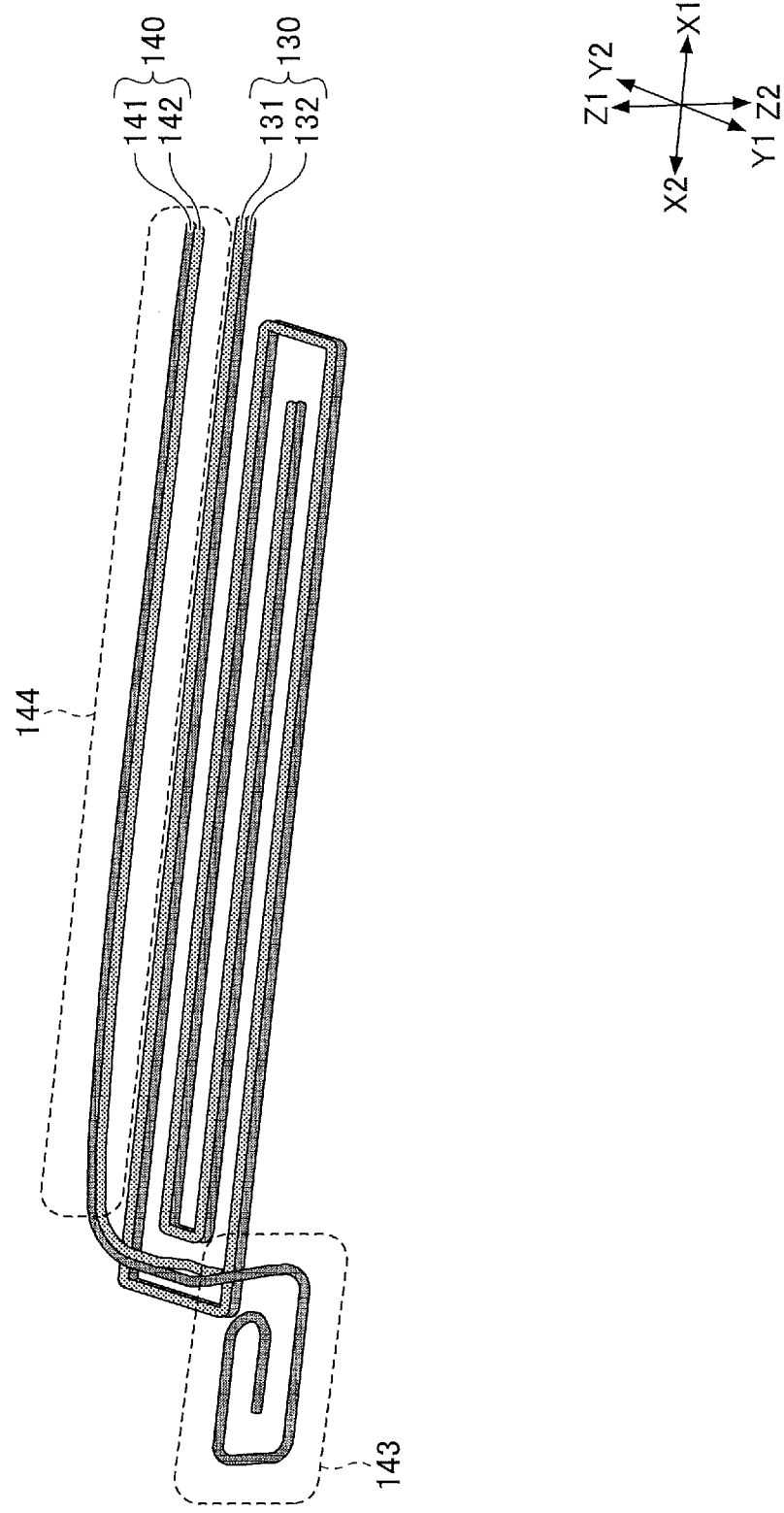
FIG. 18 is a perspective view illustrating a relationship between the locking electrostatic sensor and the unlocking electrostatic sensor according to the first embodiment.

FIG. 18 illustrates a positional relationship between the unlocking electrostatic sensor 130 and the locking electrostatic sensor 140. When unlocking the door lock, the hand approaches the vicinity of the Z2-side of the unlocking electrostatic sensor 130, however, when interconnections of the locking electrostatic sensor 140 are provided near this vicinity, the manual operation intended to unlock the door may be erroneously detected as an operation intended to lock the door. In the locking electrostatic sensor 140 according to this embodiment, a region in the vicinity of the unlocking electrostatic sensor 130 forms the non-detection region 144 in, and when the hand approaches near this region, the operation is not detected as an operation to lock the door. The operation to lock the door is detected only in the case where the hand approaches the detection region 143. Outer peripheries of the first unlock conductor 131 and the second unlock conductor 132, and outer peripheries of the first lock conductor 141 and the second lock conductor 142, are covered by an insulating material.

(Detection By Locking Electrostatic Sensor 140)

Next, detection by the locking electrostatic sensor 140 will be described. In the locking electrostatic sensor 140, a voltage is applied to each of the first lock conductor 141 and the second lock conductor 142 of the locking electrostatic sensor 140 from the control circuit 151 serving as the controller in the control device 150, and the electrostatic capacitance of the first lock conductor 141 and the second lock conductor 142 is measured.

The locking electrostatic sensor 140 according to this embodiment detects manual operation based on the difference value obtained by subtracting the value of the electrostatic capacitance detected by the second lock conductor 142 from the value of the electrostatic capacitance detected by the first lock conductor 142.

In the locking electrostatic sensor 140 according to this embodiment, since the first lock conductor 141 is formed to be longer than the second lock conductor 142, the electrostatic capacitance of the first lock conductor 141 is greater than that of the second lock conductor 142 by an amount corresponding to the difference between the lengths. Accordingly, in this embodiment, the difference value obtained by subtracting the value of the electrostatic capacitance detected by the second lock conductor 142 from the value of the electrostatic capacitance detected by the first lock conductor 141 in a state where the hand is not approaching the locking electrostatic sensor 140 is used as an initial value, and the manual operation is detected based on this initial value.

In the locking electrostatic sensor 140 according to this embodiment, the first lock conductor 141 is formed in the detection region 143, but is not formed in the second lock conductor 142. Hence, in the case where the hand approaches the detection region 143 of the locking electrostatic sensor 140, the value of the electrostatic capacitance detected by the first lock conductor 141 increases, but the value of the electrostatic capacitance detected by the second lock conductor 142 hardly changes. Accordingly, the difference value obtained by subtracting the value of electrostatic capacitance detected by the second lock conductor 142 from the value of electrostatic capacitance detected by the first lock conductor 141 becomes greater than the initial value.

In contrast, both the first lock conductor 141 and the second lock conductor 142 are formed in the non-detection region 144. Thus, in the case where the hand approaches the non-detection region 144 of the locking electrostatic sensor 140, both the electrostatic capacitance detected by the first lock conductor 141 and the electrostatic capacitance detected by the second lock conductor 142 increase, but the amount of increase in the electrostatic capacitances is approximately the same. Accordingly, the difference value obtained by subtracting the value of electrostatic capacitance detected by the second lock conductor 142 from the value of electrostatic capacitance detected by the first lock conductor 141 becomes approximately the same as the initial value.

Therefore, in a case where the initial value or a value slightly higher than the initial value is used as the reference value, when the difference value obtained by subtracting the value of the electrostatic capacitance detected by the second lock conductor 142 from the value of the electrostatic capacitance detected by the first lock conductor 141 exceeds the reference value, it is determined that the manual locking operation was performed. On the other hand, even in a case where the value of the electrostatic capacitance detected by the first lock conductor 141 and the value of the electrostatic capacitance detected by the second lock conductor 142 increase, when the difference value obtained by subtracting the value of the electrostatic capacitance detected by the second lock conductor 142 from the value of the electrostatic capacitance detected by the first lock conductor 141 is less than or equal to the reference value, it is determined that the manual locking operation was not performed.

Consequently, it is possible to detect the manual operation only when the hand approaches the detection region 143 of the locking electrostatic sensor 140, and not detect the manual operation when the hand approaches the non-detection region 144. In this manner, an erroneous detection of the door lock by the manual operation can be prevented.

Figure 19:
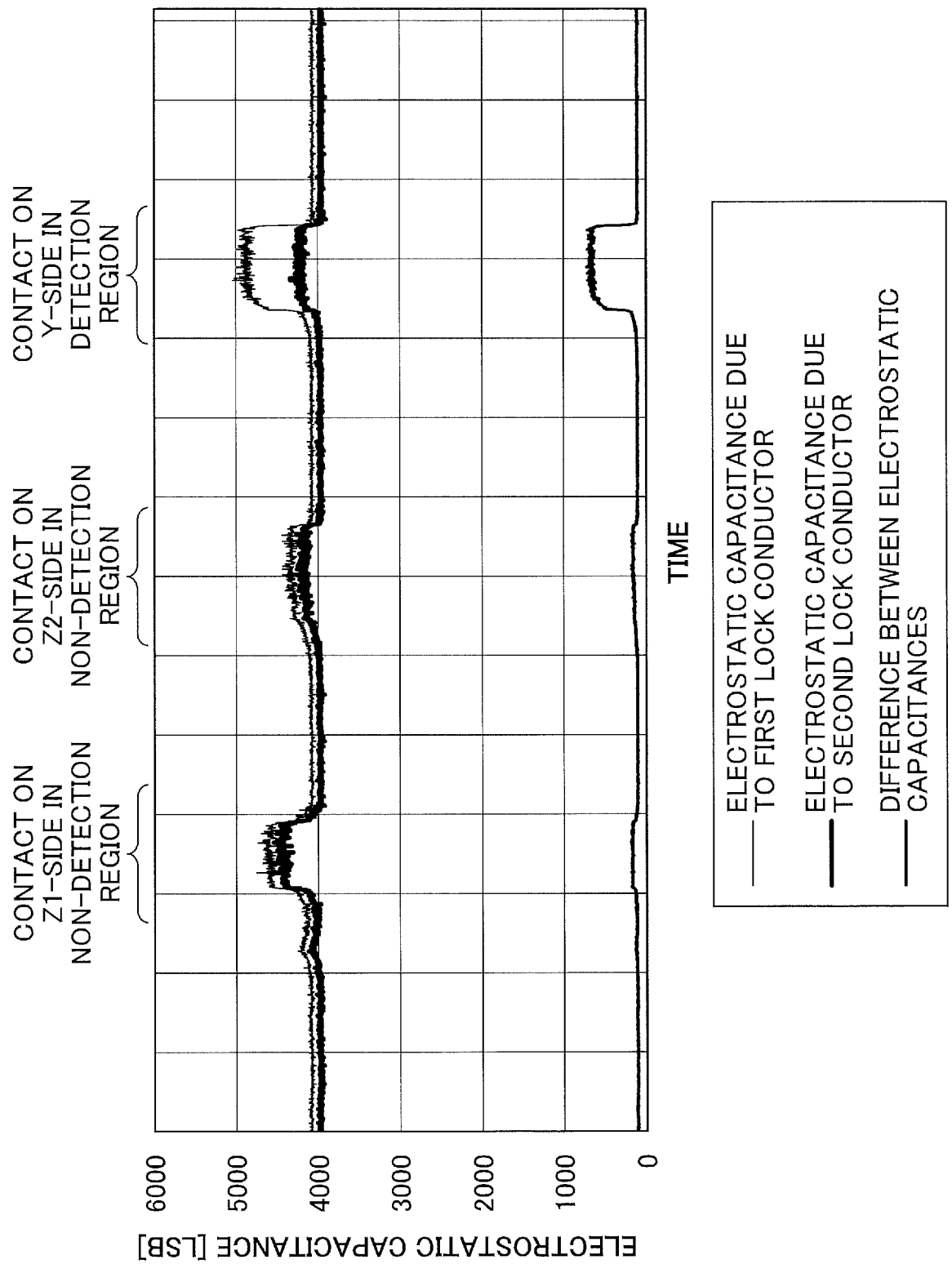
FIG. 19 is a diagram for explaining locking of the door by the door handle according to the first embodiment.

FIG. 19 illustrates the electrostatic capacitance detected by the first lock conductor 141, the electrostatic capacitance detected by the second lock conductor 142, and the difference value obtained by subtracting the electrostatic capacitance detected by the second lock conductor 142 from the electrostatic capacitance detected by the first lock conductor 141, for cases where the hand makes contact with the door handle 100 on the Z2-side of the non-detection region 144, the Z1-side of the non-detection region 144, and the Y1-side of the detection region 143 of the locking electrostatic sensor 140.

As illustrated in FIG. 19, in the case where the hand makes contact with the door handle on the Z1-side of the non-detection region 144 of the locking electrostatic sensor 140, both the electrostatic capacitance detected by the first lock conductor 141 and the electrostatic capacitance detected by the second lock conductor 142 increase, but the electrostatic capacitance detected by the first lock conductor 141 and the electrostatic capacitance detected by the second lock conductor 142 are approximately the same. Hence, the difference value obtained by subtracting the electrostatic capacitance detected by the second lock conductor 142 from the electrostatic capacitance detected by the first lock conductor 141 is approximately zero.

In addition, in the case where the hand makes contact with the door handle 100 on the Z2-side of the non-detection region 144 of the locking electrostatic sensor 140, both the electrostatic capacitance detected by the first lock conductor 141 and the electrostatic capacitance detected by the second lock conductor 142 increase, but the electrostatic capacitance detected by the first lock conductor 141 and the electrostatic capacitance detected by the second lock conductor 142 are approximately the same. Hence, the difference value obtained by subtracting the electrostatic capacitance detected by the second lock conductor 142 from the electrostatic capacitance detected by the first lock conductor 141 is approximately zero.

On the other hand, in the case where the hand makes contact with the door handle 100 on the Y1-side of the detection region 143 of the locking electrostatic sensor 140, both the electrostatic capacitance detected by the first lock conductor 141 and the electrostatic capacitance detected by the second lock conductor 142 increase, but the electrostatic capacitance detected by the first lock conductor 141 is greater than the electrostatic capacitance detected by the second lock conductor 142. Hence, the difference value obtained by subtracting the electrostatic capacitance detected by the second lock conductor 142 from the electrostatic capacitance detected by the first lock conductor 141 becomes the positive value.

Accordingly, in the control circuit 151 of the control device 150, by performing the control to lock the door 10 only when the difference value obtained by subtracting the electrostatic capacitance detected by the second lock conductor 142 from the electrostatic capacitance detected by the first lock conductor 141 becomes the positive value, it is possible to prevent the door 10 from being locked erroneously (or accidentally).

Therefore, in the door handle 100 according to this embodiment, the door 10 is locked when the hand makes contact with the detection region 143 of the locking electrostatic sensor 140, and it is judged that the manual operation is not intended to lock the door 10 and the door 10 is not locked when the hand makes contact with the non-detection region 144 of the locking electrostatic sensor 140.

Second Embodiment

Figure 20:
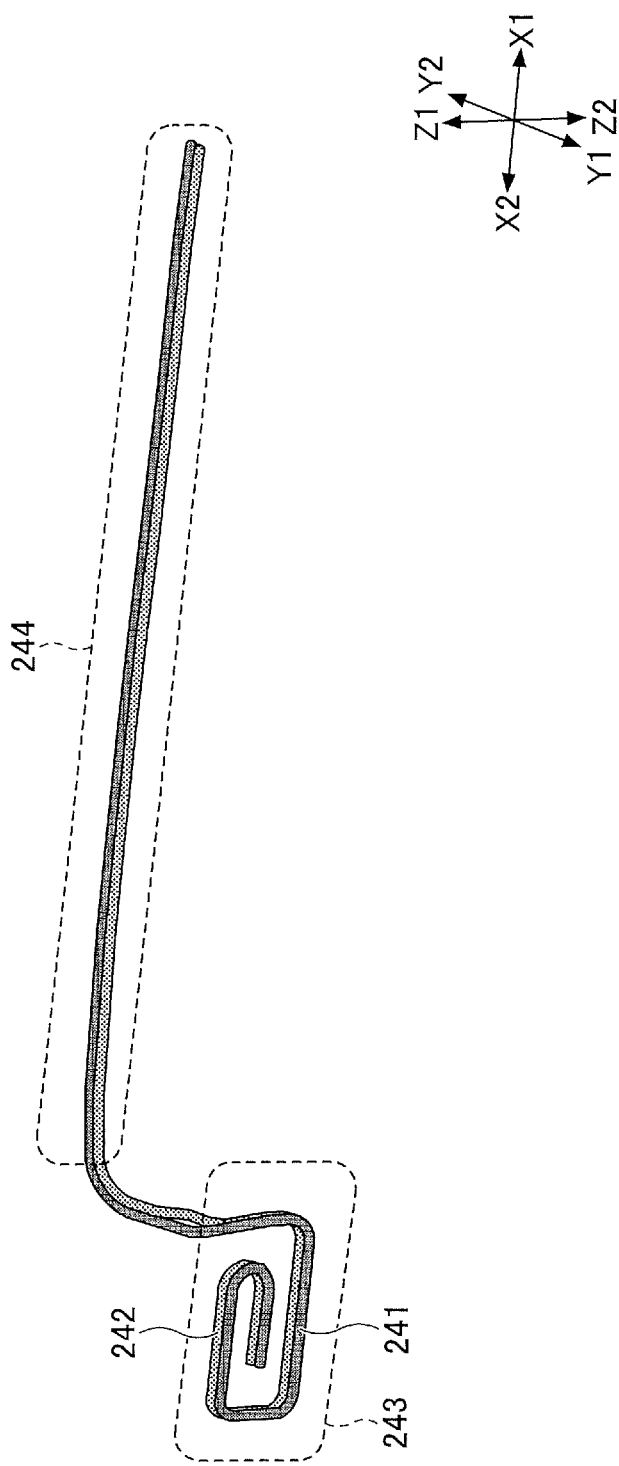
FIG. 20 is a perspective view of the locking electrostatic sensor according to a second embodiment.
Figure 21:
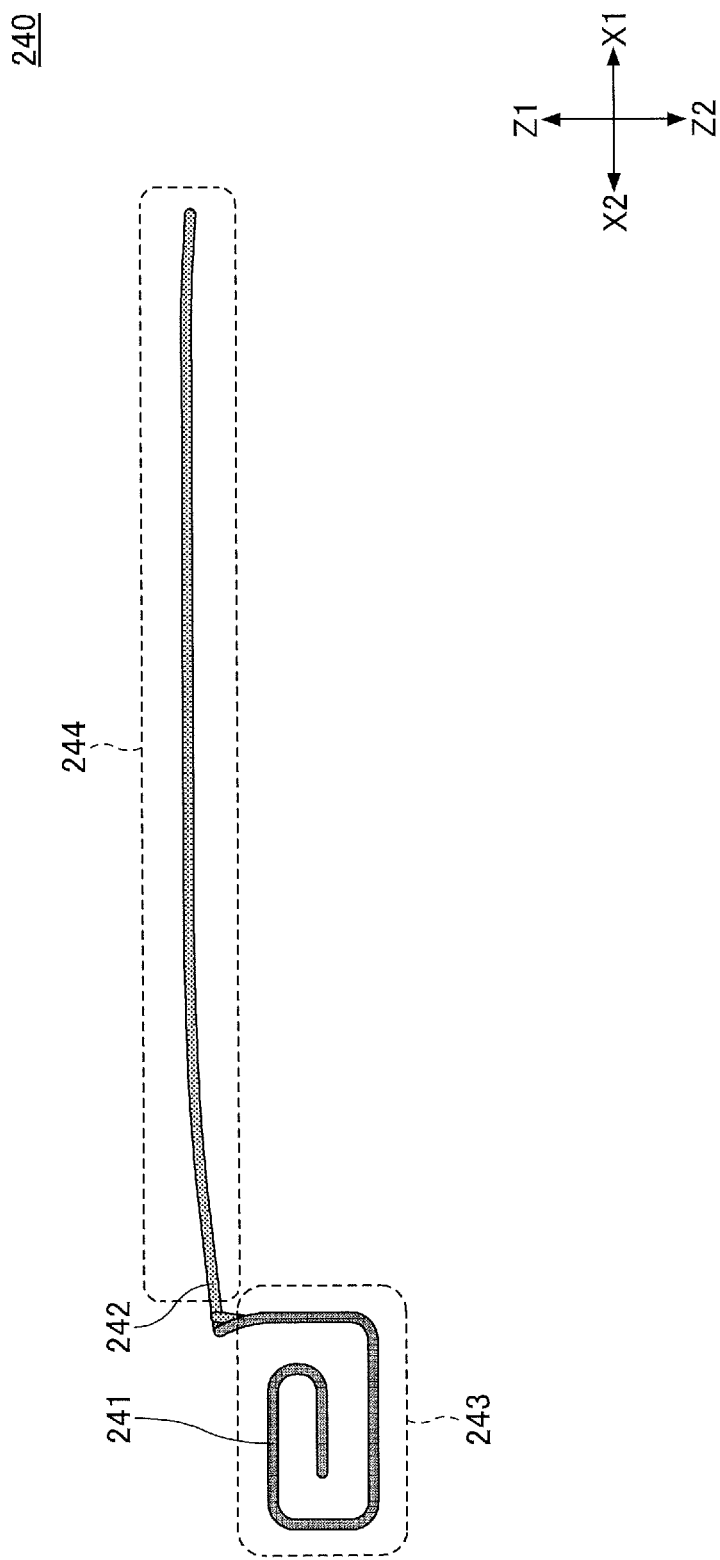
FIG. 21 is a top view of the locking electrostatic sensor according to the second embodiment.
Figure 22:
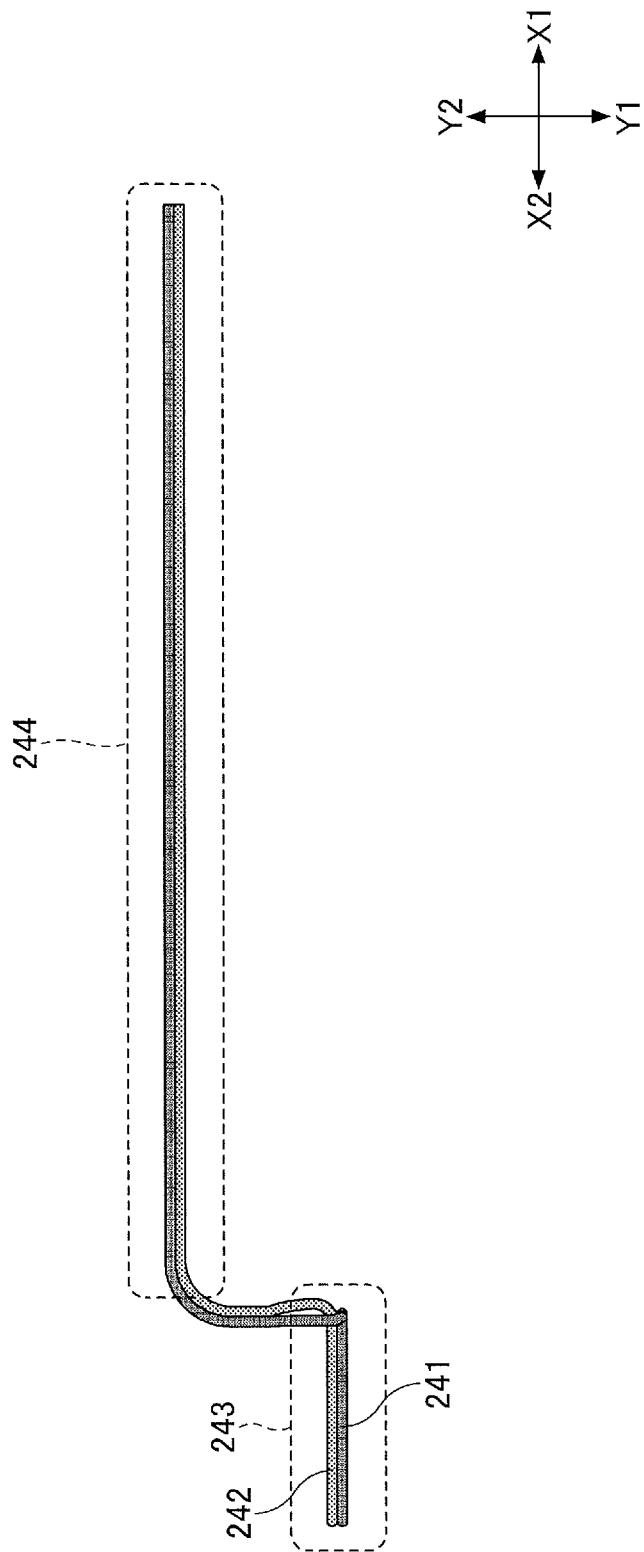
FIG. 22 is a front view of the locking electrostatic sensor according to the second embodiment.
Figure 23:
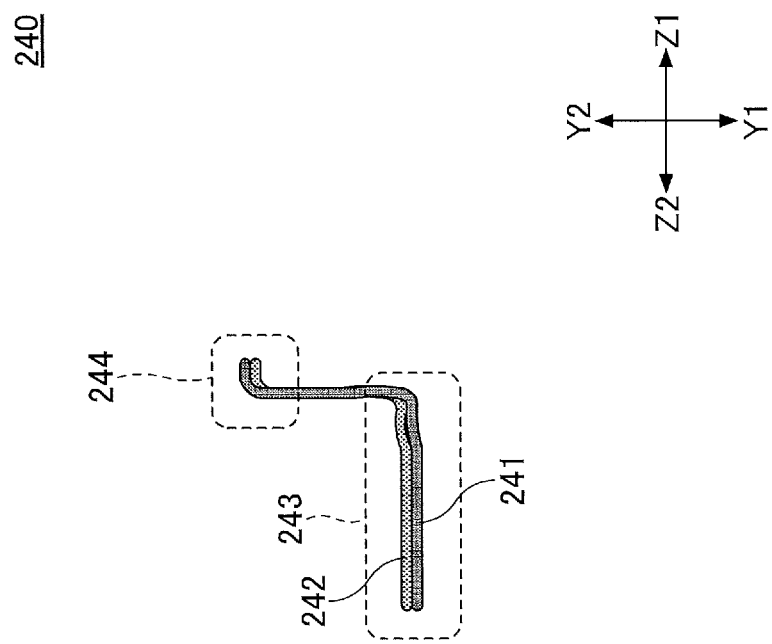
FIG. 23 is a side view of the locking electrostatic sensor according to the second embodiment.

Next, the door handle according to a second embodiment will be described. A locking electrostatic sensor 240 of the door handle according to this embodiment includes a first lock conductor 241 and a second lock conductor 242, as illustrated in FIG. 20 through FIG. 23, and the lengths of the first lock conductor 241 and the second lock conductor 242 are the same. FIG. 20 is a perspective view of the locking electrostatic sensor 240 according to this embodiment. FIG. 21 is a top view of the locking electrostatic sensor 240, FIG. 22 is a front view of the locking electrostatic sensor 240, and FIG. 23 is a side view of the locking electrostatic sensor 240.

In the locking electrostatic sensor 240, the first lock conductor 241 and the second lock conductor 242 are provided in a detection region 243, and the first lock conductor 241 is located on the Y1-side and the second lock conductor 242 is located on the Y2-side. In the detection region 243, when the hand makes contact with the Y1-side of the door handle 100, the value of the electrostatic capacitance detected by the first lock conductor 241 becomes greater than the value of the electrostatic capacitance detected by the second lock conductor 242.

Accordingly, in the control circuit 151 of the control device 150, by performing the control to lock the door 10 only when the difference value obtained by subtracting the electrostatic capacitance detected by the second lock conductor 242 from the electrostatic capacitance detected by the first lock conductor 241 becomes the positive value, it is possible to prevent the door 10 from being locked erroneously (or accidentally).

Figure 24:
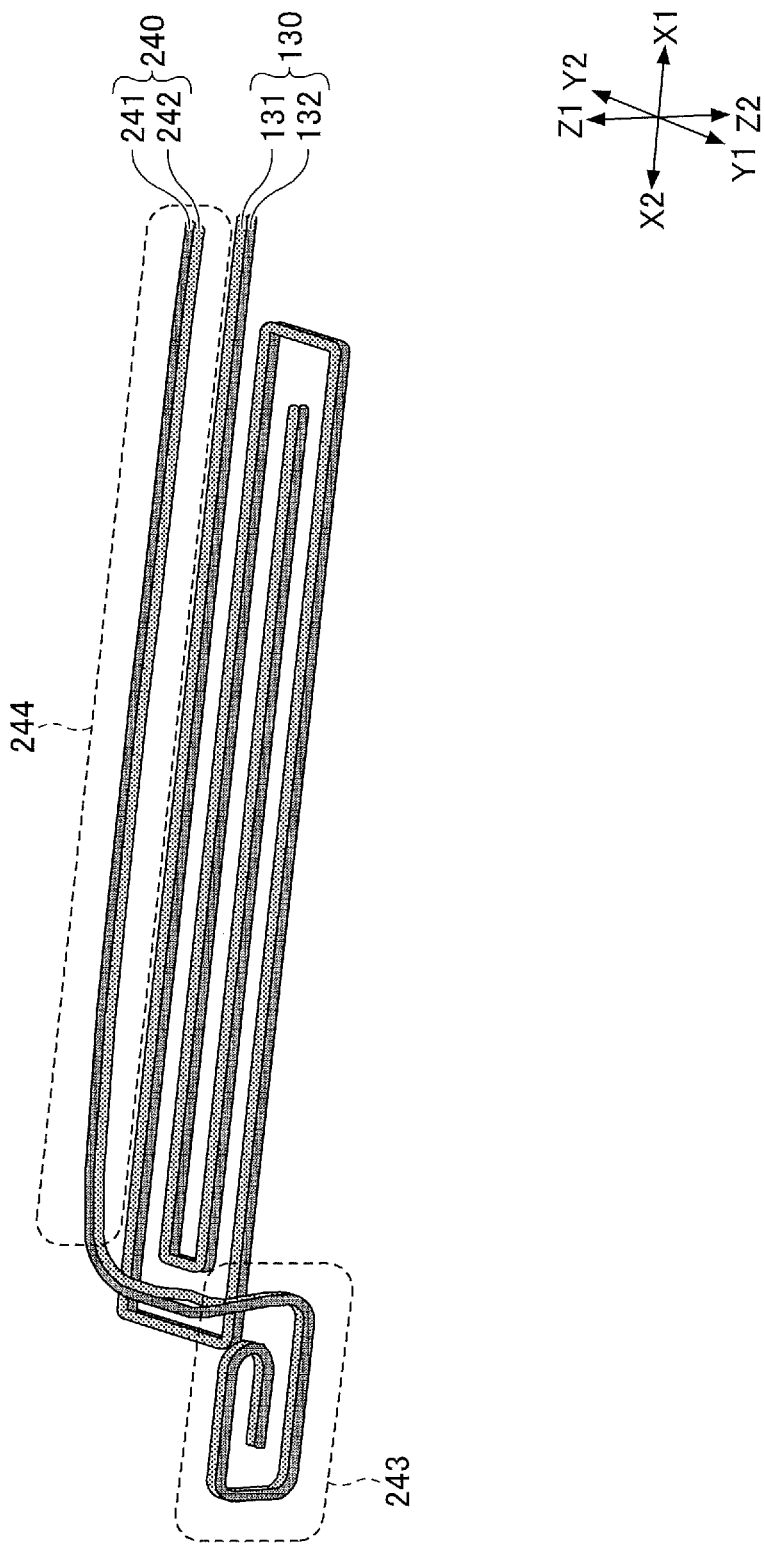
FIG. 24 is a perspective view illustrating the relationship between the locking electrostatic sensor and the unlocking electrostatic sensor according to the second embodiment.
Figure 25:
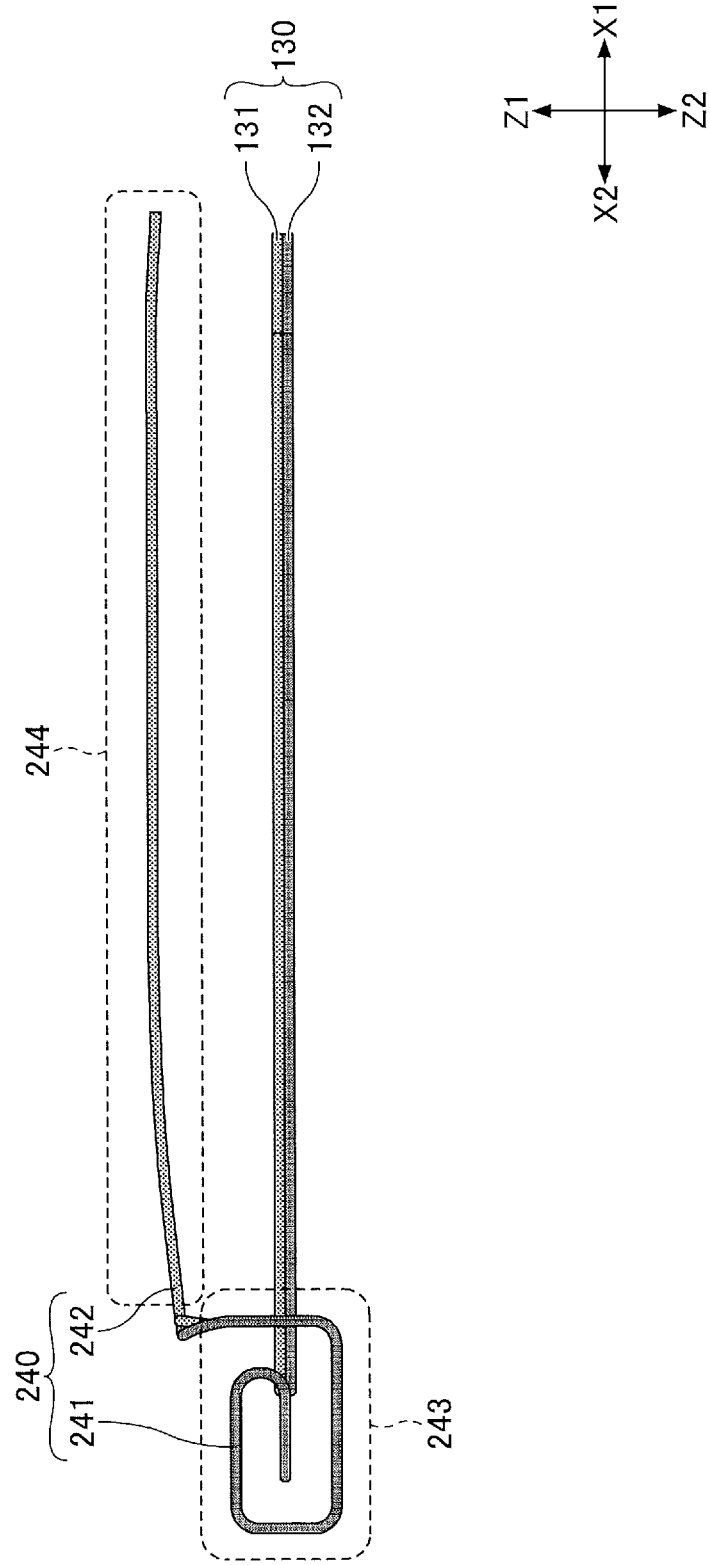
FIG. 25 is a top view illustrating the relationship between the locking electrostatic sensor and the unlocking electrostatic sensor according to the second embodiment.
Figure 26:
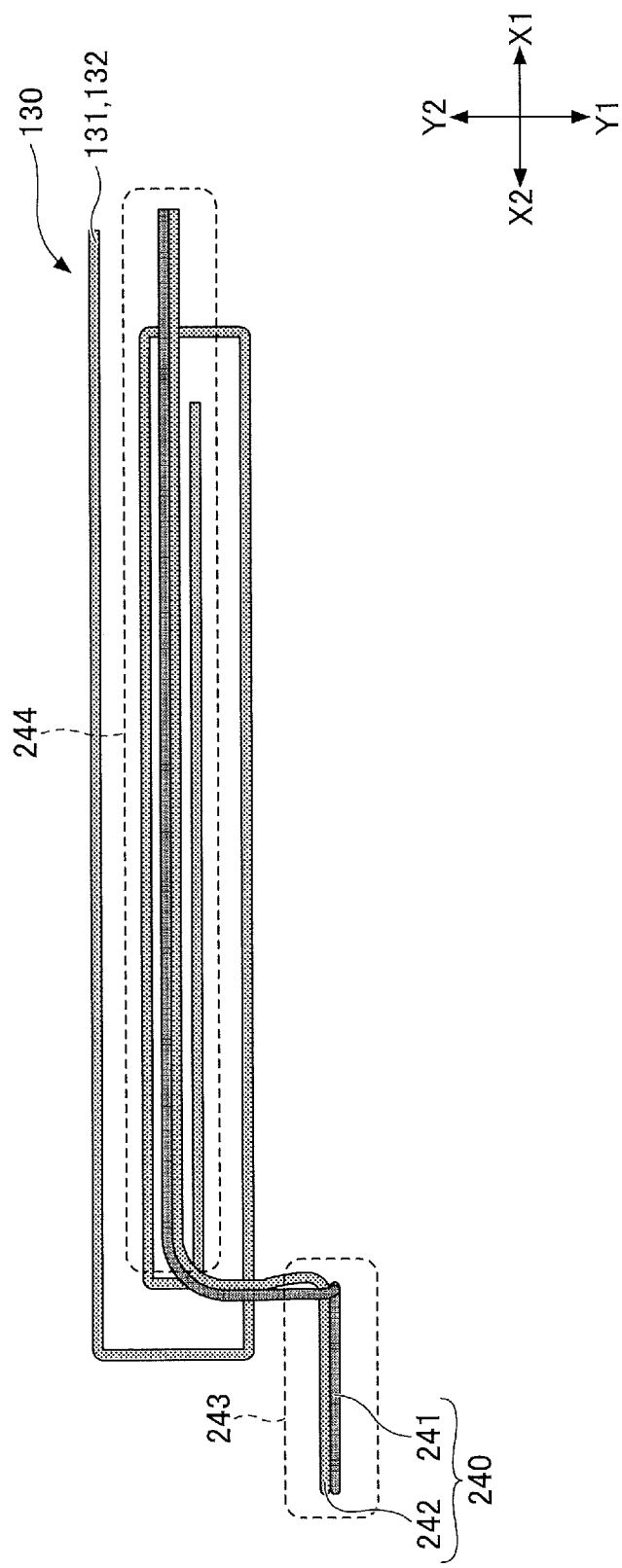
FIG. 26 is a front view illustrating the relationship between the locking electrostatic sensor and the unlocking electrostatic sensor according to the second embodiment.

In a non-detection region 244 of the locking electrostatic sensor 240 according to this embodiment, the first lock conductor 241 and the second lock conductor 242 are formed side by side along the Y1-Y2 direction, so as to prevent an erroneous detection of the unlocking operation. In other words, as illustrated in FIG. 24 through FIG. 26, the first unlock conductor 131 and the second unlock conductor 132 forming the unlocking electrostatic sensor 130, are arranged side by side along the Z1-Z2 direction, so as to detect the unlocking operation of the door 10 by the presence of the hand along the Z2 direction. FIG. 24 is a perspective view illustrating a positional relationship between the unlocking electrostatic sensor 130 and the locking electrostatic sensor 240, FIG. 25 is a top view illustrating the positional relationship, and FIG. 26 is a front view illustrating the positional relationship.

In order to prevent such an unlocking operation of the door 10 from being detected by the locking electrostatic sensor 240, in the non-detection region 244 near the unlocking electrostatic sensor 130, the first lock conductor 241 and the second lock conductor 242 of the locking electrostatic sensor 240 are arranged side by side along the Y1-Y2 direction that is perpendicular to the Z1-Z2 direction. Accordingly, even when the hand approaches the Z2-side of the non-detection region 244, the electrostatic capacitance detected by the first lock conductor 241 and the electrostatic capacitance detected by the second lock conductor 242 are approximately the same, and the difference between the electrostatic capacitance detected by the first lock conductor 241 and the second lock conductor 242 is approximately zero. For this reason, it is possible to prevent the manual operation from being erroneously detected as an operation to lock the door 10.

Therefore, in the locking electrostatic sensor 240 according to this embodiment, in the non-detection region 244, the Y1-Y2 direction in which the first lock conductor 241 and the second lock conductor 242 of the locking electrostatic sensor 240 are arranged, and the Z1-Z2 direction in which the first unlock conductor 131 and the second unlock conductor 132 of the unlocking electrostatic sensor 130 are arranged, are approximately perpendicular to each other.

The operation detection device according to this embodiment may be applied to other than the door handle of the vehicle. For example, the operation detection device may be applied to a so-called kick sensor used in the vehicle.

The contents of this embodiment, other than those described above, may be the same as those of the first embodiment.

Third Embodiment

Figure 27:
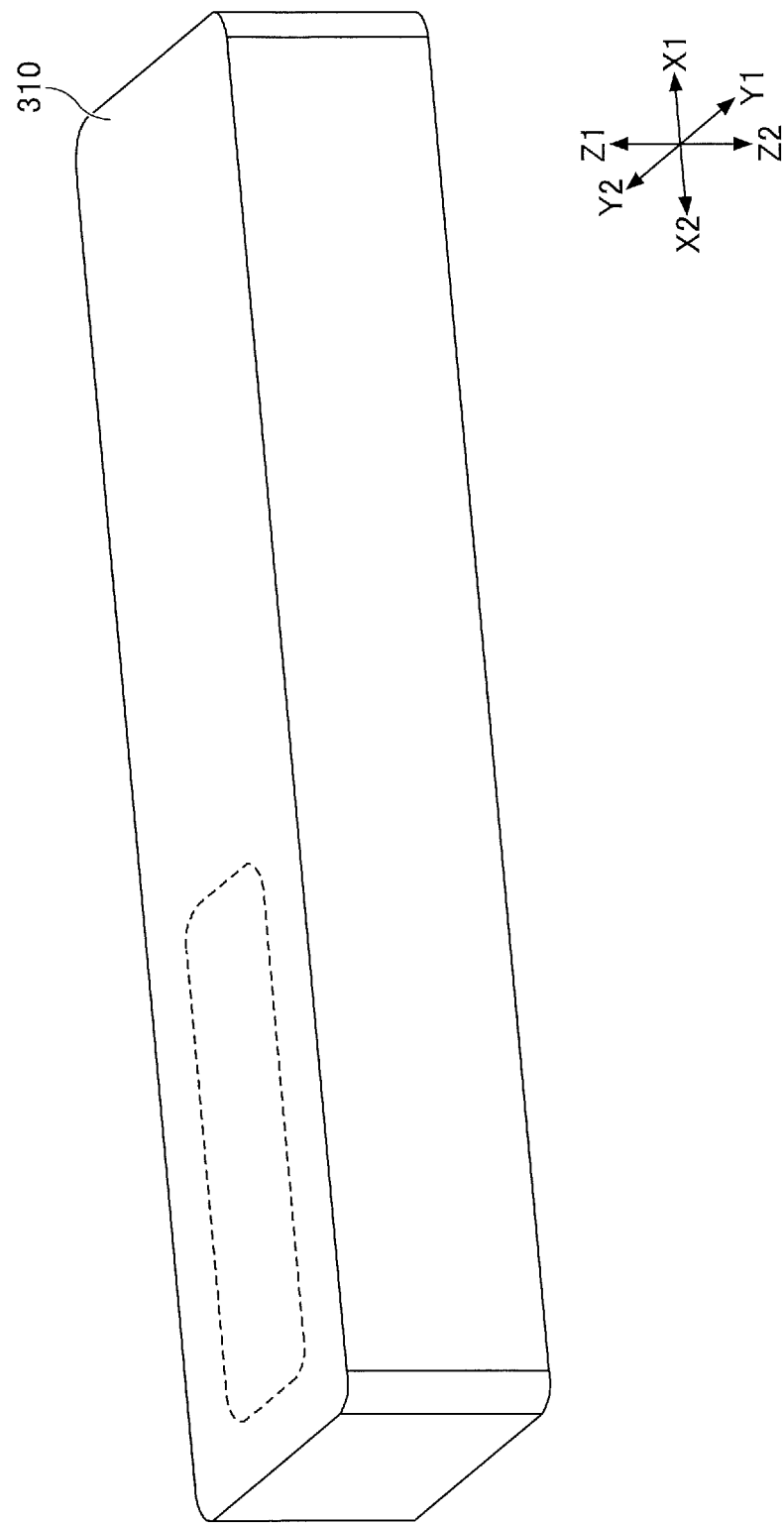
FIG. 27 is a perspective view of the locking electrostatic sensor according to a third embodiment accommodated within a casing.
Figure 28:
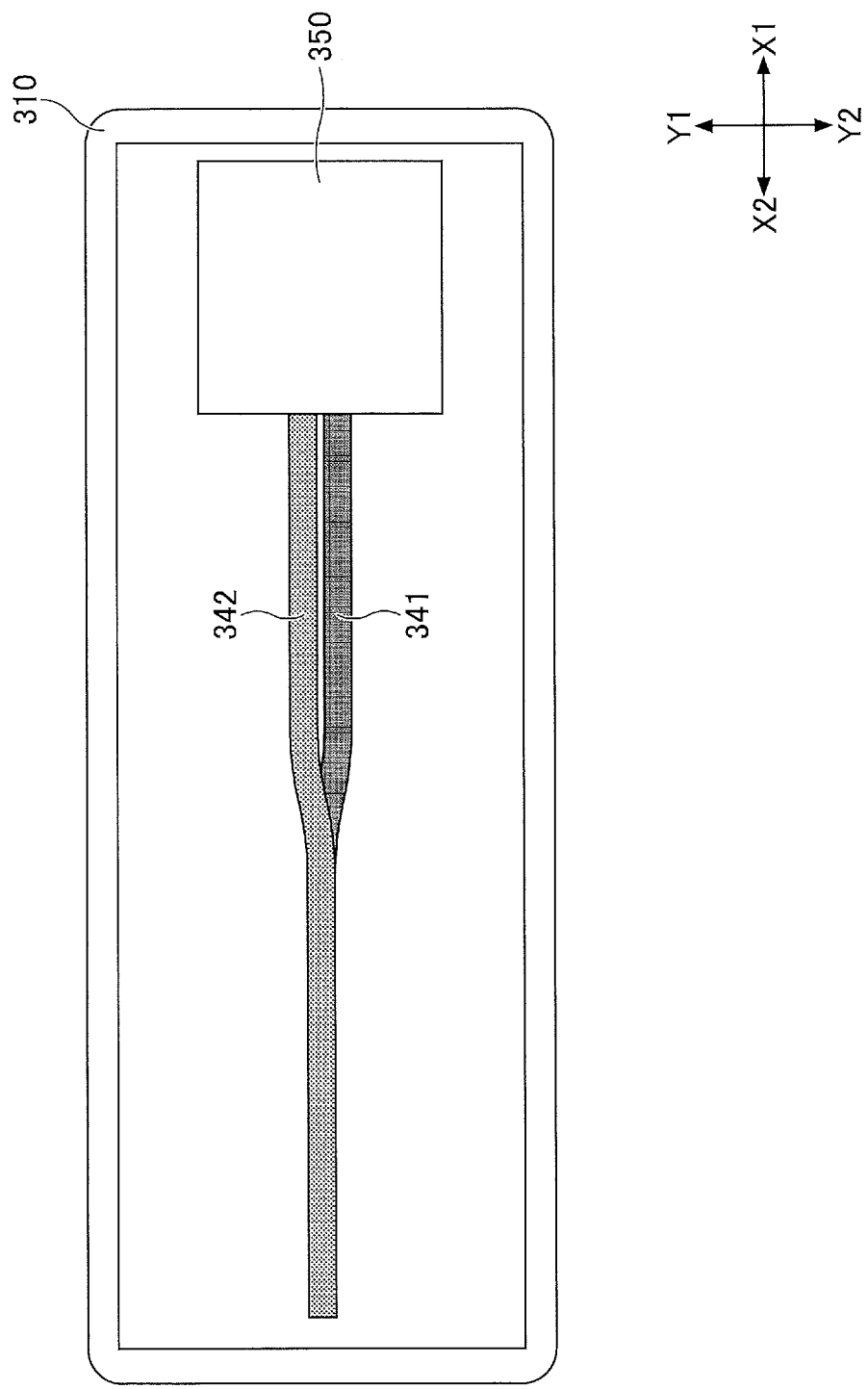
FIG. 28 is a rear view of the locking electrostatic sensor according to the third embodiment accommodated within the casing.
Figure 29:
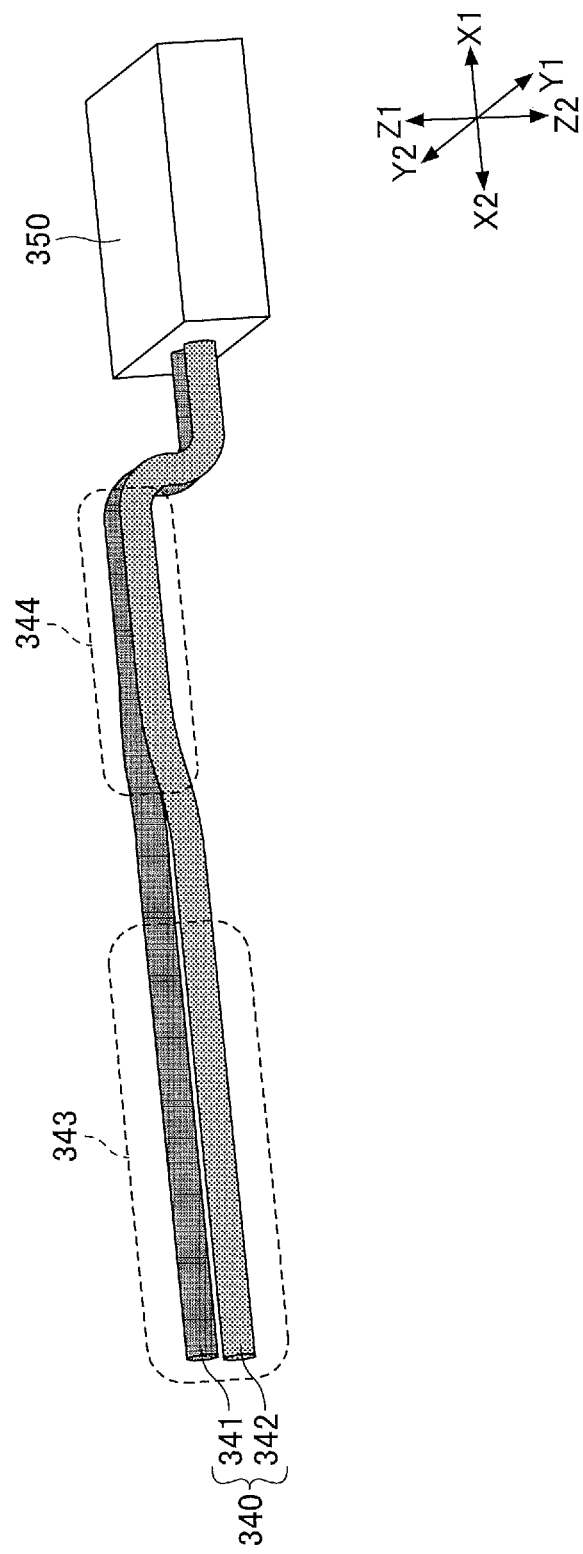
FIG. 29 is a perspective view of the locking electrostatic sensor according to the third embodiment.
Figure 30:
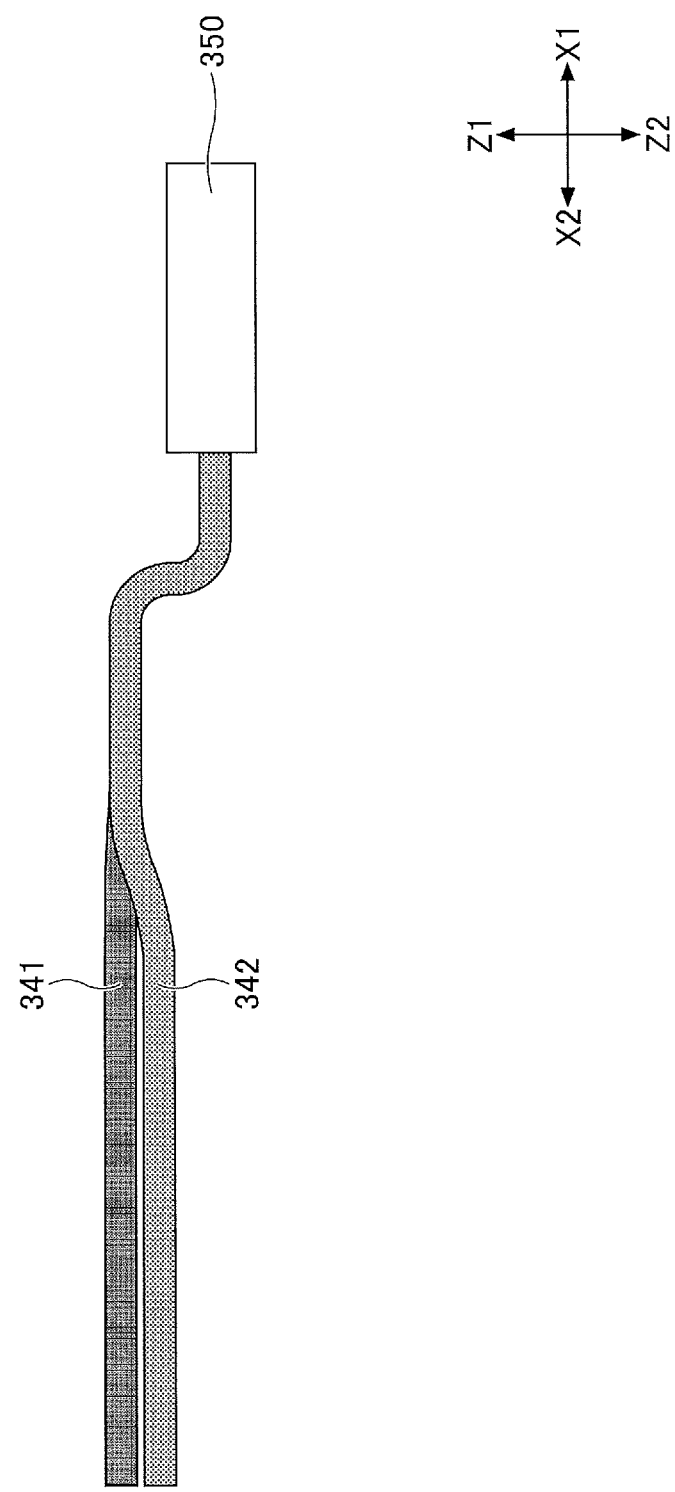
FIG. 30 is a top view of the locking electrostatic sensor according to the third embodiment.
Figure 31:
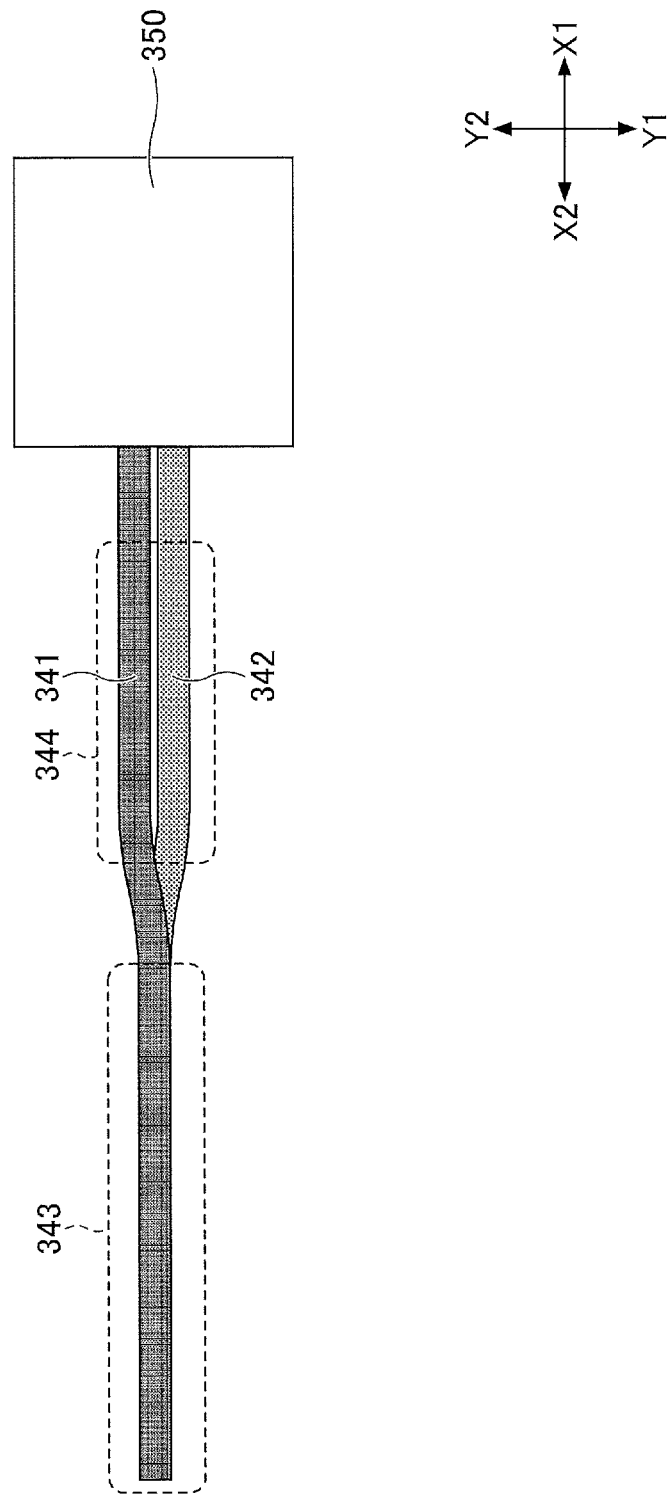
FIG. 31 is a front view of the locking electrostatic sensor according to the third embodiment.
Figure 32:
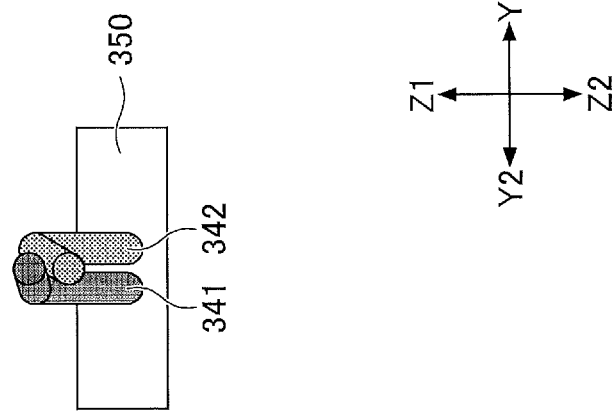
FIG. 32 is a side view of the locking electrostatic sensor according to the third embodiment.

Next, an electrostatic sensor according to a third embodiment will be described. As illustrated in FIG. 27 through FIG. 32, an electrostatic sensor 340 according to this embodiment is provided inside a casing 310. The electrostatic sensor 240 includes a first electrostatic detection conductor 341 and a second electrostatic detection conductor 342, and the lengths of the first electrostatic detection conductor 341 and the second electrostatic detection conductor 342 are the same. FIG. 27 is a perspective view of the electrostatic sensor 340 according to this embodiment accommodated inside the casing 310, and FIG. 28 is a rear view of the electrostatic sensor 340 accommodated inside the casing. FIG. 29 is a perspective view of the electrostatic sensor 340 according to this embodiment, FIG. 30 is a top view of the electrostatic sensor 340, FIG. 31 is a front view of the electrostatic sensor 340, and FIG. 32 is a side view of the electrostatic sensor 340.

The electrostatic sensor 340 according to this embodiment includes the first electrostatic detection conductor 341 and the second electrostatic detection conductor 342 extending in the X1-X2 direction, the X2-side of the electrostatic sensor 340 forms a detection region 343, and the X1-side of the electrostatic sensor 340 forms a non-detection region 344. A control device (or control unit, or processor) 350 is connected to an end on the X1-side of the non-detection region 344. Accordingly, the non-detection region 344 is provided between the detection region 343 and the control device 350. Similar to the control device 150 of the first embodiment, the control device 350 has a structure in which a circuit board, mounted with a control circuit, is covered by a casing and a lid.

In the detection region 343 of the electrostatic sensor 340 according to this embodiment, the first electrostatic detection conductor 341 and the second electrostatic detection conductor 342 are arranged side by side along the Z1-Z2 direction, so that the first electrostatic detection conductor 341 is provided on the Z1-side and the second electrostatic detection conductor 342 is provided on the Z2-side. In the non-detection region 344, the first electrostatic detection conductor 341 and the second electrostatic detection conductor 342 are arranged side by side along the Y1-Y2 direction, so that the first electrostatic detection conductor 341 is provided on the Y2-side and the second electrostatic detection conductor 342 is provided on the Y1-side. Accordingly, the first electrostatic detection conductor 341 and the second electrostatic detection conductor 342 are twisted by approximately 90° between the detection region 343 and the non-detection region 344, and the Z1-Z2 direction in which the first electrostatic detection conductor 341 and the second electrostatic detection conductor 342 are arranged side by side in the detection region 343, is perpendicular to the Y1-Y2 direction in which the first electrostatic detection conductor 341 and the second electrostatic detection conductor 342 are arranged side by side in the non-detection region 344.

In the electrostatic sensor 340 according to this embodiment, when the hand or the like approaches the detection region 343 of the electrostatic sensor 340 from the Z1 direction, the value of the electrostatic capacitance detected by the first electrostatic detection conductor 341 becomes greater than the value of the electrostatic capacitance detected by the second electrostatic detection conductor 342. On the other hand, when the hand or the like approaches the non-detection region 344 of the electrostatic sensor 340 from the Z1 direction, both the value of the electrostatic capacitance detected by the first electrostatic detection conductor 341 and the value of the electrostatic capacitance detected by the second electrostatic detection conductor 342 increase, but the amount of increase in the value of the electrostatic capacitance detected by the first electrostatic detection conductor 341 is approximately the same as the amount of increase in the value of the electrostatic capacitance detected by the second electrostatic detection conductor 342.

Accordingly, the difference between the value of the electrostatic capacitance detected by the first electrostatic detection conductor 341 and the value of the electrostatic capacitance detected by the second electrostatic detection conductor 342, calculated in the control device 350, becomes the difference between the value of the electrostatic capacitance detected by the first electrostatic detection conductor 341 and the value of the electrostatic capacitance detected by the second electrostatic detection conductor 342 in the detection region 343, because the difference between the value of the electrostatic capacitance detected by the first electrostatic detection conductor 341 and the value of the electrostatic capacitance detected by the second electrostatic detection conductor 342 in the non-detection region 344 is approximately zero.

Hence, it is possible to detect the difference between the value of the electrostatic capacitance detected by the first electrostatic detection conductor 341 and the value of the electrostatic capacitance detected by the second electrostatic detection conductor 342 in the detection region 343.

In order to prevent the erroneous detection of the manual operation in the electrostatic sensor 340 according to this embodiment, in the non-detection region 344 of the electrostatic sensor 340, the first electrostatic detection conductor 341 and the second electrostatic detection conductor 342 are famed side by side along the Y1-Y2 direction. Accordingly, even in the case where the hand or the like approaches from the Z1 direction, the difference between the value of the electrostatic capacitance detected by the first electrostatic detection conductor 341 and the value of the electrostatic capacitance detected by the second electrostatic detection conductor 342 is approximately zero, and thus, the hand or the like will not be detected as approaching.

Accordingly, by performing a control by the control circuit in the control device 350 to detect the approaching hand or the like and detect the manual operation only when the difference value obtained by subtracting the electrostatic capacitance detected by the second electrostatic detection conductor 342 from the electrostatic capacitance detected by the first electrostatic detection conductor 341 is the positive value, it is possible to prevent an erroneous detection of the manual operation.

According to the disclosed operation detection device and door handle, it is possible to detect the manual operation with respect to the door handle only when the hand approaches a specific region.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An operation detection device comprising:
an electrostatic sensor, accommodated inside a casing, and including a first conductor and a second conductor; and
a controller electrically connected to the first conductor and the second conductor,
wherein the controller applies a voltage to each of the first conductor and the second conductor, to measure a first electrostatic capacitance of the first conductor and a second electrostatic capacitance of the second conductor,
wherein the first conductor is arranged in and the second conductor is not arranged in a detection region in which an operating body is detected by the electrostatic sensor, wherein the first electrostatic capacitance of the first conductor increases when the operating body approaches the detection region and wherein the second electrostatic capacitance of the second conductor does not increase when the operating body approaches the detection region, and
wherein the first conductor and the second conductor are arranged in a non-detection region in which the operating body is not detected, wherein the first conductor and second conductor are arranged side by side in a direction perpendicular to a direction in which the operating body approaches the electrostatic sensor, wherein when the operating body approaches the non-detecting region, the first electrostatic capacitance of the first conductor increases and the second electrostatic capacitance of the second conductor increases, wherein the increase in value of the first electrostatic capacitance of the first conductor and the increase in value of the second electrostatic capacitance of the second conductor are approximately equal.

2. The operation detection device as claimed in claim 1, wherein the controller detects an operation of the operating body based on a difference between the first electrostatic capacitance detected by the first conductor and the second electrostatic capacitance detected by the second conductor.

3. The operation detection device as claimed in claim 1, wherein the controller detects an operation of the operating body based on a difference value that is obtained by subtracting the second electrostatic capacitance detected by the second conductor from the first electrostatic capacitance detected by the first conductor.

4. The operation detection device as claimed in claim 3, wherein the controller determines that the operation is performed by the operating body when the difference value exceeds a predetermined value, or a change in the difference value occurs in a positive direction.

5. The operation detection device as claimed in claim 4, wherein the controller determines that the operation is not performed when the difference value is less than or equal to the predetermined value, or the change in the difference value occurs in a negative direction.

6. The operation detection device as claimed in claim 1, wherein the non-detection region is provided between the detection region and the controller.

7. A door handle to be mounted on a door of a vehicle, comprising:
the operation detection device according to claim 1, wherein the casing is a door handle casing, formed by an inner casing and an outer casing.

8. An operation detection device comprising:
an electrostatic sensor, accommodated inside a casing, and including a first conductor and a second conductor; and
a controller electrically connected to the first conductor and the second conductor,
wherein the controller applies a voltage to each of the first conductor and the second conductor, to measure a first electrostatic capacitance of the first conductor and a second electrostatic capacitance of the second conductor,
wherein the first conductor and the second conductor are arranged side by side along a first direction in a detection region in which an operating body is detected by the electrostatic sensor, wherein when the operating body approaches the detection region, the first electrostatic capacitance of the first conductor is greater than the second electrostatic capacitance of the second conductor,
wherein the first conductor and the second conductor are arranged side by side along a second direction in a non-detection region in which the operating body is not detected, wherein when the operating body approaches the non-detecting region, the first electrostatic capacitance of the first conductor increases and the second electrostatic capacitance of the second conductor increases, wherein the increase in value of the first electrostatic capacitance of the first conductor and the increase in value of the second electrostatic capacitance of the second conductor are approximately equal, and
wherein the first direction and the second direction are approximately perpendicular to each other.

9. The operation detection device as claimed in claim 8, wherein the detection region detects the operating body when the operating body approaches the electrostatic sensor along the first direction.

10. The operation detection device according to claim 8, wherein the first conductor and the second conductor are twisted between the detection region and the non-detection region, so that the first direction in which the first conductor and the second conductor are arranged side by side in the detection region is approximately perpendicular to the second direction in which the first conductor and the second conductor are arranged side by side in the non-detection region.

11. The operation detection device as claimed in claim 8, wherein the controller detects an operation of the operating body based on a difference between the first electrostatic capacitance detected by the first conductor and the second electrostatic capacitance detected by the second conductor.

12. The operation detection device as claimed in claim 8, wherein the controller detects an operation of the operating body based on a difference value that is obtained by subtracting the second electrostatic capacitance detected by the second conductor from the first electrostatic capacitance detected by the first conductor.

13. The operation detection device as claimed in claim 12, wherein the controller determines that the operation is performed by the operating body when the difference value exceeds a predetermined value, or a change in the difference value occurs in a positive direction.

14. The operation detection device as claimed in claim 13, wherein the controller determines that the operation is not performed when the difference value is less than or equal to the predetermined value, or the change in the difference value occurs in a negative direction.

15. The operation detection device as claimed in claim 8, wherein the non-detection region is provided between the detection region and the controller.

16. A door handle to be mounted on a door of a vehicle, comprising:
    the operation detection device according to claim 8,
    wherein the casing is a door handle casing, formed by an inner casing and an outer casing.

17. A door handle comprising:
    a locking electrostatic sensor, accommodated inside a door handle casing that is formed by an inner casing and an outer casing, and including a first lock conductor and a second lock conductor;
    an unlocking electrostatic sensor, accommodated inside the door handle casing, and including a first unlock conductor and a second unlock conductor; and
    a controller electrically connected to the first lock conductor, the second lock conductor, the first unlock conductor, and the second unlock conductor,
    wherein controller applies a voltage to each of the first lock conductor, the second lock conductor, the first unlock conductor, and the second unlock conductor, to measure a first electrostatic capacitance of the first lock conductor, a second electrostatic capacitance of the second lock conductor, a third electrostatic capacitance of the first unlock conductor, and a fourth electrostatic capacitance of the second unlock conductor,
    wherein the first lock conductor and the second lock conductor are arranged in a direction approximately perpendicular with respect to a detection surface where an operating body makes contact with the door handle in a detection region in which the operating body is detected by the locking electrostatic sensor, wherein when the operating body approaches the detection region, the first electrostatic capacitance of the first lock conductor is greater than the second electrostatic capacitance of the second lock conductor, and
    wherein a direction in which the first unlock conductor and the second unlock conductor are arranged is approximately perpendicular to a direction in which the first lock conductor and the second lock conductor are arranged in a non-detection region in which the operating body is detected by the unlocking electrostatic sensor but the operating body is not detected by the locking electrostatic sensor, wherein when the operating body approaches the non-detecting region, the first electrostatic capacitance of the first lock conductor increases and the second electrostatic capacitance of the second lock conductor increases, wherein the increase in value of the first electrostatic capacitance of the first lock conductor and the increase in value of the second electrostatic capacitance of the second lock conductor are approximately equal.

18. The door handle as claimed in claim 17, wherein the controller detects the operation of the operating body based on a difference value that is obtained by subtracting a value of the second electrostatic capacitance detected by the second lock conductor from the first electrostatic capacitance detected by the first lock conductor.

* * * * *